(12) United States Patent
Tan

(10) Patent No.: US 10,873,302 B2
(45) Date of Patent: Dec. 22, 2020

(54) FOUR WAVE MIXING TRANSMISSION LINE

(71) Applicant: Oxford University Innovation Limited, Oxford (GB)

(72) Inventor: Boon Kok Tan, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 134 days.

(21) Appl. No.: 16/080,972

(22) PCT Filed: Mar. 3, 2017

(86) PCT No.: PCT/GB2017/050572
§ 371 (c)(1),
(2) Date: Aug. 29, 2018

(87) PCT Pub. No.: WO2017/149319
PCT Pub. Date: Sep. 8, 2017

(65) Prior Publication Data
US 2019/0074801 A1 Mar. 7, 2019

(30) Foreign Application Priority Data

Mar. 3, 2016 (GB) .................................. 1603700.4

(51) Int. Cl.
*H03F 3/189* (2006.01)
*H03F 19/00* (2006.01)
(Continued)

(52) U.S. Cl.
CPC ........... *H03F 3/189* (2013.01); *G02F 1/3536* (2013.01); *H03F 3/54* (2013.01); *H03F 7/00* (2013.01); *H03F 7/02* (2013.01); *H03F 19/00* (2013.01)

(58) Field of Classification Search
CPC ... H03F 3/189; H03F 3/54; H03F 7/00; H03F 7/02; H03F 19/00; G02F 1/3536
(Continued)

(56) References Cited

U.S. PATENT DOCUMENTS

2008/0130097 A1  6/2008 Mckinstrie
2015/0241481 A1  8/2015 Narla et al.

OTHER PUBLICATIONS

Li et al., "Design of an Ultra-wideband Transition from Double-sided Microstrip to Parallel-strip line for Balanced-type Antenna", published in the Recent Advances in Electrical & Electronic Engineering, 2018, vol. 11, p. 76-79 (Year: 2018).*

(Continued)

*Primary Examiner* — Benny T Lee
*Assistant Examiner* — Hafizur Rahman
(74) *Attorney, Agent, or Firm* — Knobbe Martens Olson & Bear, LLP

(57) ABSTRACT

A four-wave mixing transmission line (3) including: an input (15, 17, 19) arranged to receive: a first pump signal (7a) having a first pump frequency; a second pump signal (7b), having a second pump frequency, different to the first pump frequency; and an input signal to be amplified (5); a non-linear medium (3a) having an intrinsic dispersion relationship, the medium (3a) arranged to allow interaction between the input signal (5), the first pump signal (7a) and the second pump signal (7b), such that the input signal (5) is amplified and an idler signal (9) is generated and amplified; and a plurality of dispersion control elements (31, 33, 49), the dispersion control elements (31, 33, 49) arranged to alter the dispersion relationship of the medium (3a) to diverge from the intrinsic dispersion relationship at one or more frequencies, such that the total phase difference between the input signal, (5) the first pump signal (7a), the second pump signal (7b) and the idler signal (9) is kept at zero or substantially zero as the first pump signal (7a), the second pump signal (7b), the input signal (5) and the idler signal (9) propagate down the transmission line (3).

19 Claims, 16 Drawing Sheets

(51) Int. Cl.
  *H03F 3/54*  (2006.01)
  *H03F 7/00*  (2006.01)
  *G02F 1/35*  (2006.01)
  *H03F 7/02*  (2006.01)

(58) Field of Classification Search
  USPC .................................................. 330/61 R
  See application file for complete search history.

(56) References Cited

OTHER PUBLICATIONS

Eom et al., "A Wideband, Low-Noise Superconducting Amplifier with High Dynamic Range," arxiv.org, Cornell University Library, 201 Olin Library Cornell University Ithaca, NY 14853, Jan. 11, 2012, in 23 pages.

Kamal et al., "Signal-to-pump back action and self-oscillation in double-pump Josephson parametric amplifier," Physical Review B, Condensed Matter and Materials Physics, vol. 79, No. 18, May 2, 2009, in 26 pages.

O'Brien et al., "Resonantly phase-matched Josephson junction traveling wave parametric amplifier," Jun. 9, 2014, retrieved from the Internet: https://arxiv.org/pdf/1406.2346.pdf, in 8 pages.

International Search Report and Written Opinion from corresponding International Patent Application No. PCT/GB2017/050572, dated May 15, 2017, in 11 pages.

C. Macklin et al., "A near-quantum-limited Josephson traveling-wave parametric amplifier," Sciencexpress Reports, Sep. 3, 2015, in 8 pages.

O. Yaakobi et al., "Parametric amplification in Josephson junction embedded transmission lines," Physical Review B, vol. 87, Apr. 1, 2013, pp. 144301-1 to 144301-9.

\* cited by examiner

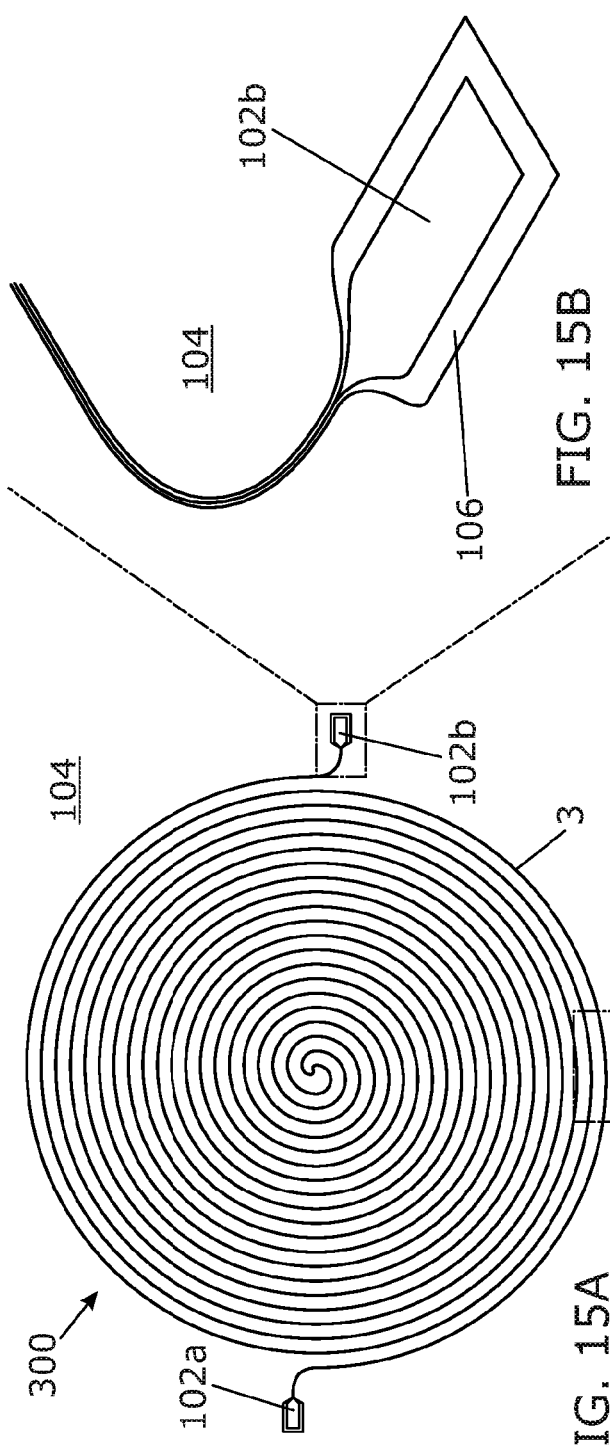
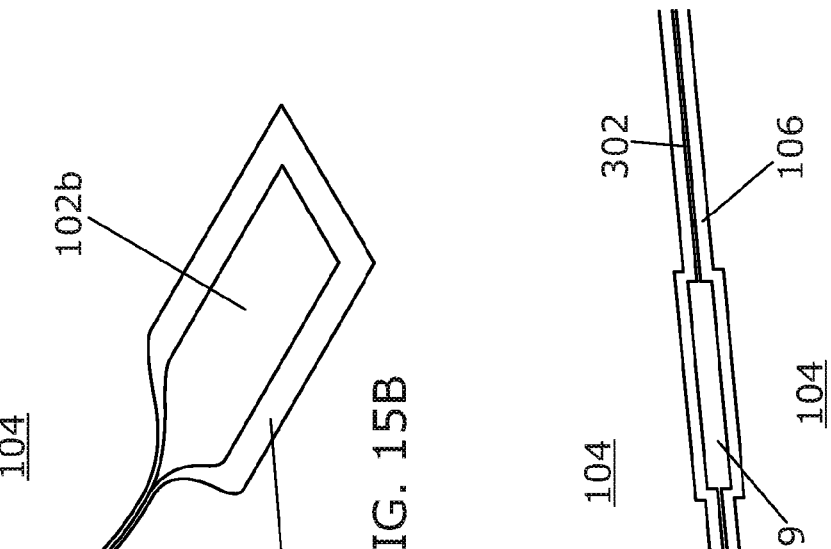
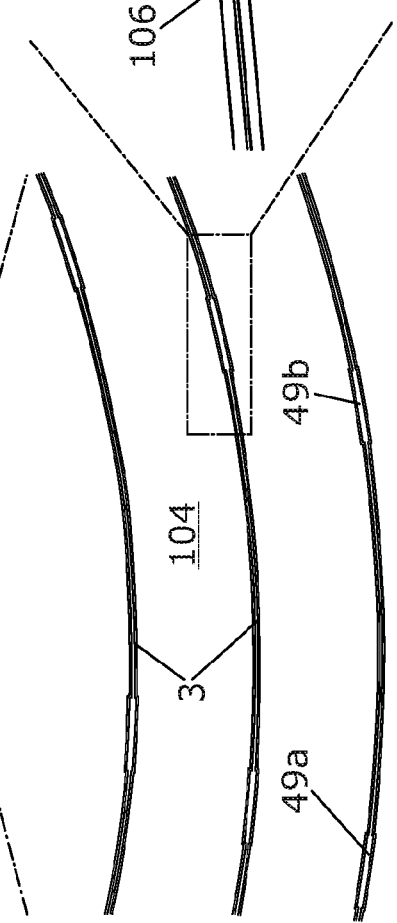
FIG. 15A
FIG. 15B
FIG. 15C
FIG. 15D

FOUR WAVE MIXING TRANSMISSION LINE

The present invention relates to a four-wave mixing transmission line. In particular, but not exclusively, the present invention relates to a four-wave mixing transmission line for use in a travelling wave parametric amplifier or frequency converter.

In quantum noise limited amplifiers, the noise is reduced to near the quantum limit, meaning the accuracy of the amplifier approaches the fundamental limit of accuracy imposed by the uncertainty principle. These amplifiers are useful in a wide range of applications, including readout of qubits, and astronomical instrumentation, where it can be necessary to detect a single photon. Parametric amplifiers are one example of an amplifier that could potentially achieve noise levels approaching the quantum limit.

In parametric amplifiers, an input signal is amplified by interacting with a pump signal in a non-linear medium, such that energy is transferred from the pump signal to the input signal. This process is also known as three-wave mixing. To achieve large gain, the interaction time must be maximised. This can be achieved using a resonant cavity, however, such use of a cavity results in a narrow operational bandwidth, over which the amplifier has a useful amount of gain. Travelling wave parametric amplifiers (TWPAs) utilise long transmission lengths rather than a cavity, and have increased operational bandwidths.

The interaction between the pump signal and input signal can also be used to generate a new signal at a different frequency, known as the idler signal, and other higher order harmonics. Therefore, the long transmission line could also be used as a frequency converter.

Fibre optics can be used to provide long transmission lines for optical signals with minimal loss. However, for signals from radio frequencies to terahertz frequencies, other systems must be used. In one example, transmission lines embedded with arrays of superconducting Josephson junctions can be used to amplify a broad range of signals. In another example, transmission lines formed from superconducting wires with non-linear kinetic inductance can be used. In order to achieve optimum gain (or idler signal generation), the pump signal, the input signal and the generated idler signal should be phase matched.

"A wideband, low-noise superconducting amplifier with high dynamic range", Byeong Ho Eom et al, Nature Physics, b, 623 2012, discloses a TWPA formed from a superconducting wire. Loading elements are provided periodically along the wire to provide stopbands at predetermined frequencies in the dispersion relation of the wire, enabling phase matching between the input signal, idler signal, and the pump signal.

"Resonant Phase Matching of Josephson Junction Traveling Wave Parametric Amplifiers", Kevin O'Brien et al, Physical Review Letters, 113, 157001, 2014 discloses a TWPA formed from an array of Josephson junctions. A series of resonators are coupled to the Josephson junction embedded superconducting transmission line. The resonators again provide a stopband at a predetermined frequency in the dispersion relation of the array, giving phase matching between the input signal, idler signal and the pump signal.

In both cases, there is a region within the operational bandwidth, where there is no gain. In other words, for certain frequencies of input signal, there is no gain. This is because no signals propagate down the transmission line when the input signal, pump signal or idler signal has a frequency in the stopband. The region of no gain coincides with the stopband in the dispersion relationship, and falls in the centre of the bandwidth. Furthermore, the gain tails off from the centre of the band, rather than remaining constant over a considerable portion of the bandwidth, meaning the gain of the amplifier is variable depending on the frequency of the input signal.

According to an aspect of the invention, there is provided a four-wave mixing transmission line. The transmission line may include an input arranged to receive a first pump signal having a first pump frequency; a second pump signal, having a second pump frequency, different to the first pump frequency; and an input signal to be amplified. The transmission line may further include a non-linear medium having an intrinsic dispersion relationship, the medium arranged to allow interaction between the input signal, the first pump signal and the second pump signal, such that the input signal is amplified and an idler signal is generated and amplified; and a plurality of dispersion control elements, the dispersion control elements arranged to alter the dispersion relationship of the medium to diverge from the intrinsic dispersion relationship at one or more frequencies such that the total phase difference between the input signal, the first pump signal, the second pump signal and the idler signal is kept at zero or substantially zero as the first pump signal, the second pump signal, the input signal and the idler signal propagate down the transmission line.

The four-wave mixing transmission line can be used to provide a travelling wave parametric amplifier with low noise levels that can reach the quantum limit, wideband operation with constant gain across the operational bandwidth, and which does not have any region in the operational bandwidth where there is no gain. The transmission line can also be used to provide low noise frequency conversion of an input signal through generation of an idler signal, or other inter-mixing harmonics.

The medium and dispersion control elements may be arranged such that the dispersion relationship of the medium diverges from the intrinsic dispersion relationship at the one or more frequencies, such that there are stopbands at the one or more frequencies.

The medium and dispersion control elements may be arranged such that the dispersion relationship may vary asymptotically at the one or more frequencies.

The operational bandwidth of the transmission line may be between a minimum operation frequency at or substantially at the first pump frequency, and a maximum operational frequency at or substantially at the second pump frequency.

The dispersion relationship of the medium may be arranged such that there is no gain at the one or more frequencies.

The first pump frequency may be near a first of the one or more frequencies.

The dispersion relationship of the medium may be arranged to diverge from the intrinsic dispersion relationship at a first of the one or more frequencies, and at a second of the one or more frequencies, different to the first.

The first pump frequency may be near the first of the one or more frequencies, and the second pump frequency may be near the second of the one or more frequencies The dispersion control elements may be arranged to correct phase mismatch between the pump signals, the input signal and the idler signal.

The dispersion control elements may be arranged periodically along the transmission line.

The medium may comprise a superconducting structure.

The plurality of dispersion control elements may comprise a plurality of resonators. The plurality of dispersion control elements may comprise one or more sets of resonators, each set of resonators comprising: a plurality of resonators having the same or substantially similar resonant frequency, wherein the resonant frequency of each set of resonators defines the one or more frequencies at which the dispersion relationship of the medium to diverge from the intrinsic dispersion relationship.

The four-wave mixing transmission line may comprise a plurality of Josephson junctions embedded along the transmission line. The four-wave mixing transmission line may be formed of a periodically repeating structure having a group of Josephson junctions connected in series, each group of Josephson junctions coupled to a dispersion control element.

Alternatively, the transmission line may be a superconducting wire.

The transmission line may be a superconducting wire, and the plurality of dispersion control elements may comprise a plurality of regions where the impedance of the wire is altered, such that the wire is loaded at the regions. The impedance of the wire may be altered in the plurality of regions by altering the width of the wire.

The transmission line may comprise a plurality of first regions where the impedance of the wire is altered, and a plurality of second where the impedance of the wire is altered, the first regions being of first length, and the second regions being of second length, different to the first, the first and second regions arranged in a pattern to prevent formation of shockwaves in the transmission line, generated from third harmonics of the pump signals.

The first and second regions may be arranged in a repeating pattern having two first regions followed by a second region. The spacing of the regions and the pattern of the first and second regions may determine the one or more frequencies.

The pump input may comprise: a first pump input for receiving the first pump signal; a second pump input for receiving the second pump signal; and an input for receiving the input signal to be amplified.

According to another aspect of the invention, there is provided a four-wave mixing method in a non-linear medium having an intrinsic dispersion relationship, the method including: providing a first pump signal having a first pump frequency in the medium; providing a second pump signal having a second pump frequency, different to the first pump frequency, in the medium; receiving an input signal to be amplified in the medium; enabling interaction between the first pump signal, the second pump signal and the input signal such that the input signal is amplified, and an idler signal is generated and amplified; and controlling the dispersion relationship of the medium to diverge from the intrinsic dispersion relationship at one or more frequencies, such that the total phase difference between the input signal, the first pump signal, the second pump signal, and the idler signal is kept at zero or substantially zero, as the first pump signal, the second pump signal, the input signal, and the idler signal propagate down the transmission line.

It will be appreciated that optional features of the first aspect may also be included in the second aspect.

Embodiments of the invention will now be further described by way of example only with respect to the following drawings in which:

FIG. 1A schematically illustrates a travelling wave parametric amplifier having a single pump signal;

FIG. 1B schematically illustrates energy levels for three-wave mixing in the amplifier of FIG. 1A;

FIG. 1C schematically illustrates the gain profile of a first example of an amplifier as shown in FIG. 1A;

FIG. 1D schematically illustrates the gain profile of a second example of an amplifier as shown in FIG. 1A;

FIG. 2A schematically illustrates a travelling wave parametric amplifier having a dual pump signals;

FIG. 2B schematically illustrates energy levels for four wave mixing in the amplifier of FIG. 2A;

FIG. 3 schematically illustrates the structure of a transmission line for use in the amplifier of FIG. 2A;

Figure 4A:
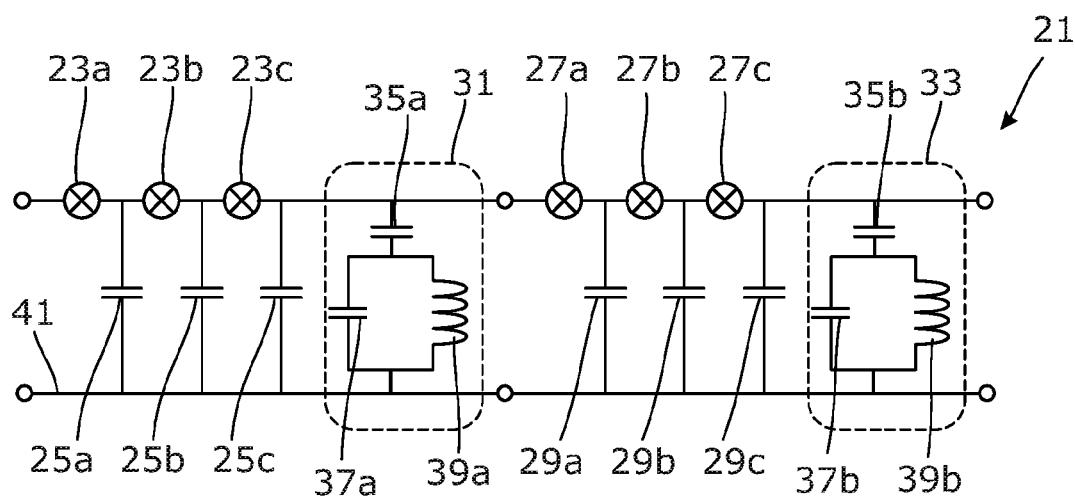
FIG. 4A illustrates a circuit diagram for use in a Josephson junction based travelling wave parametric amplifier.
Figure 6A:
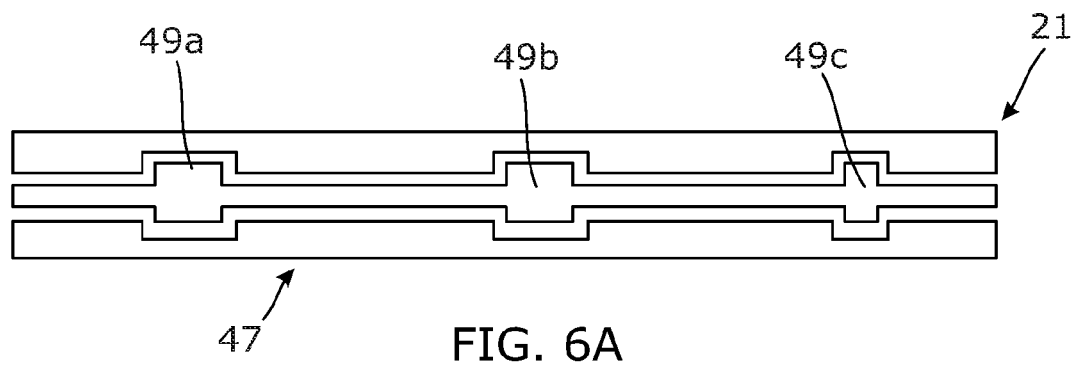
Figure 5A:
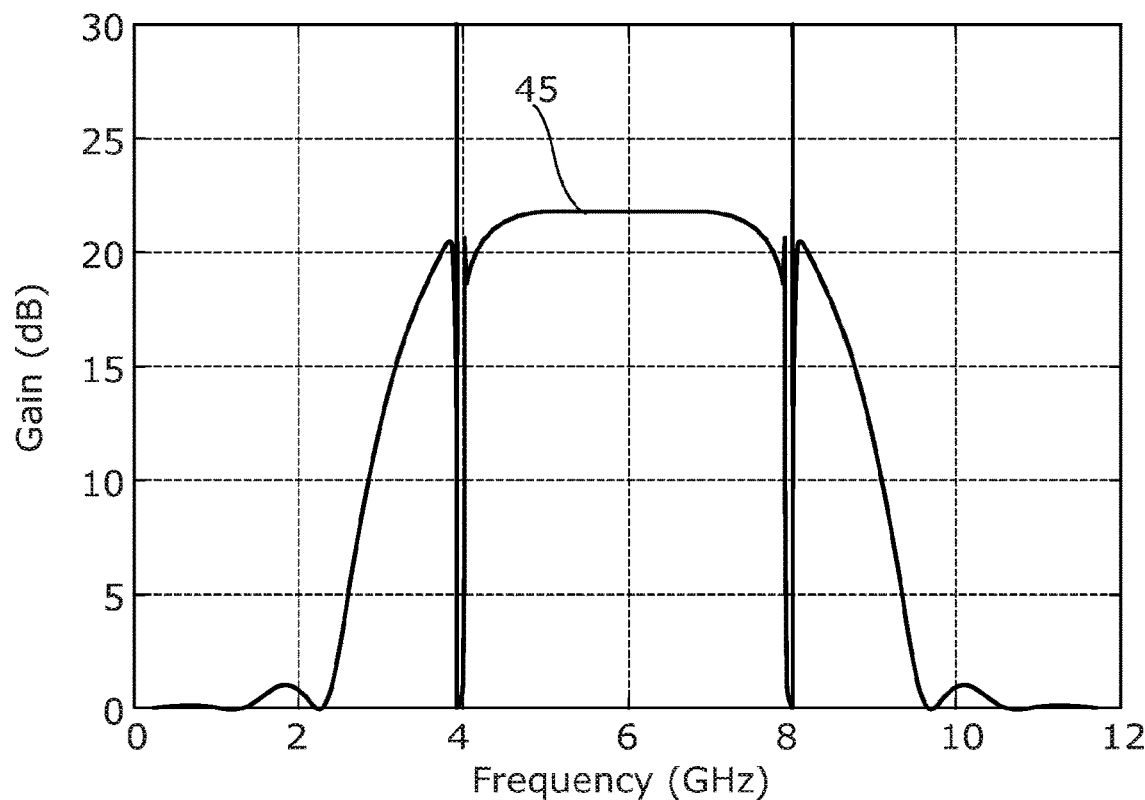
Figure 5B:
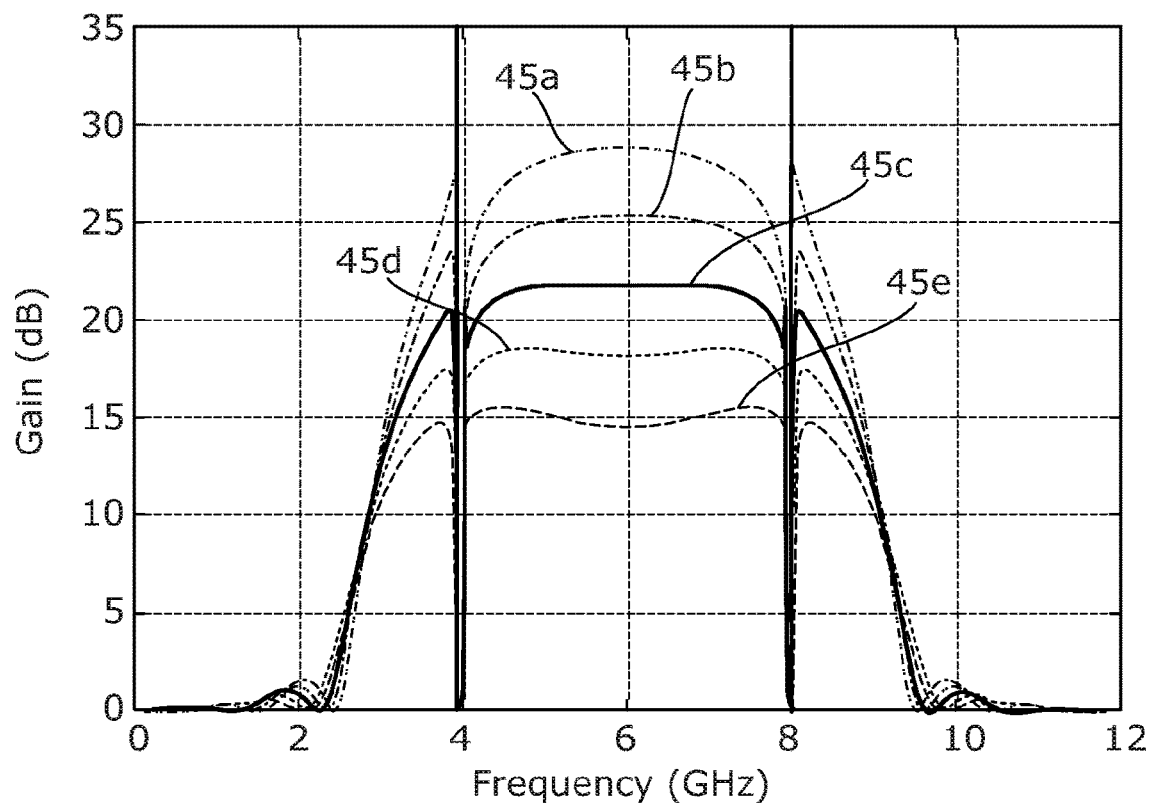
Figure 5C:
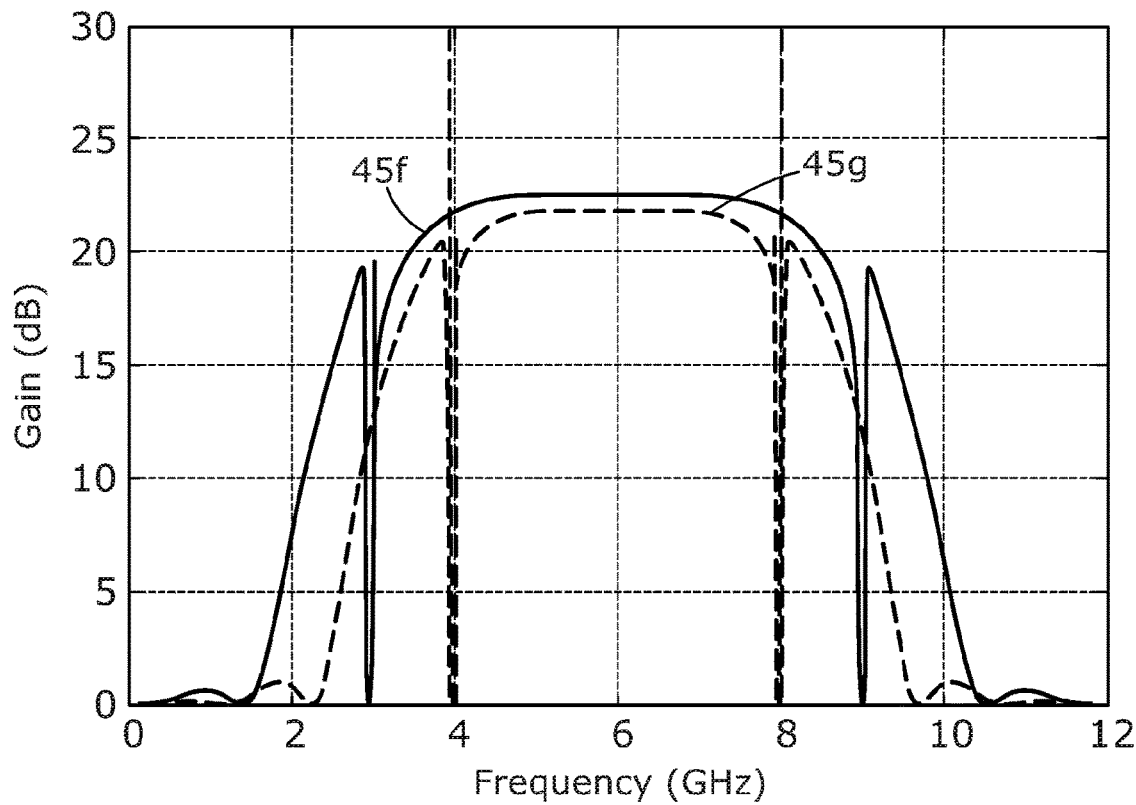
Figure 6B:
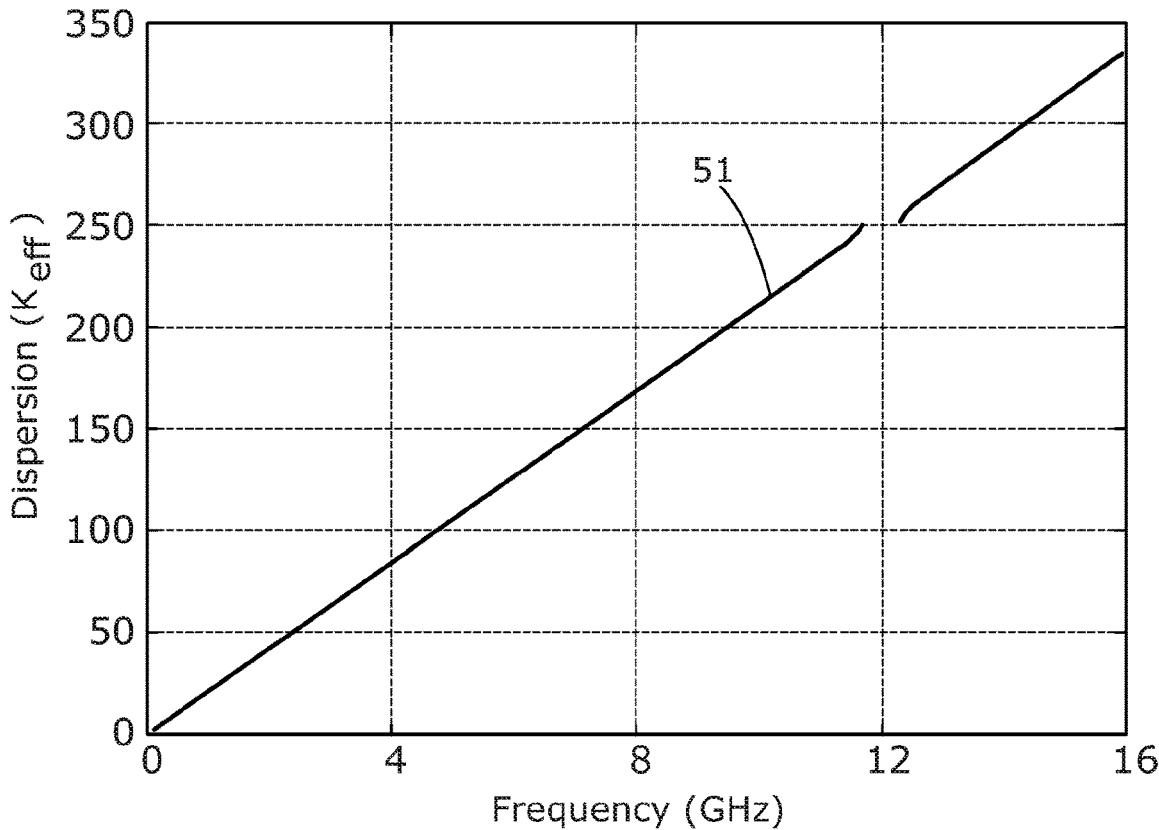
Figure 6C:
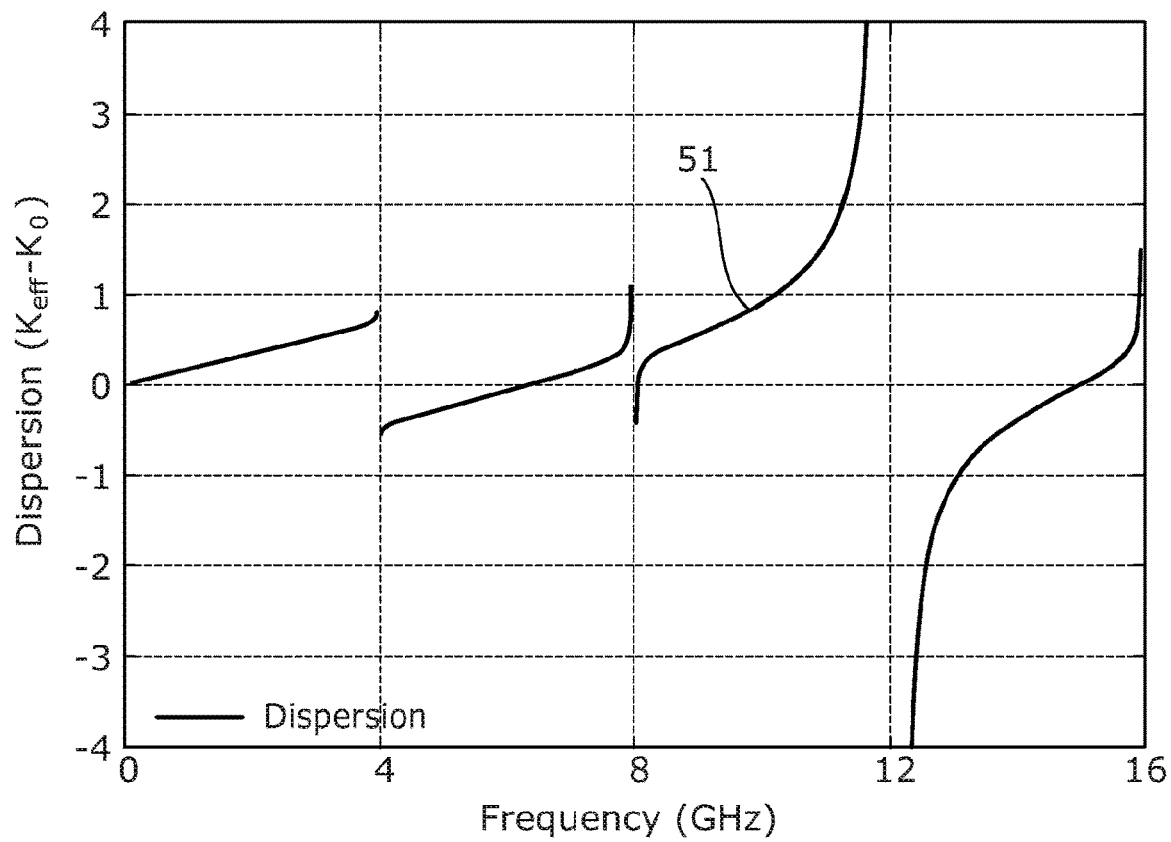
Figure 7:
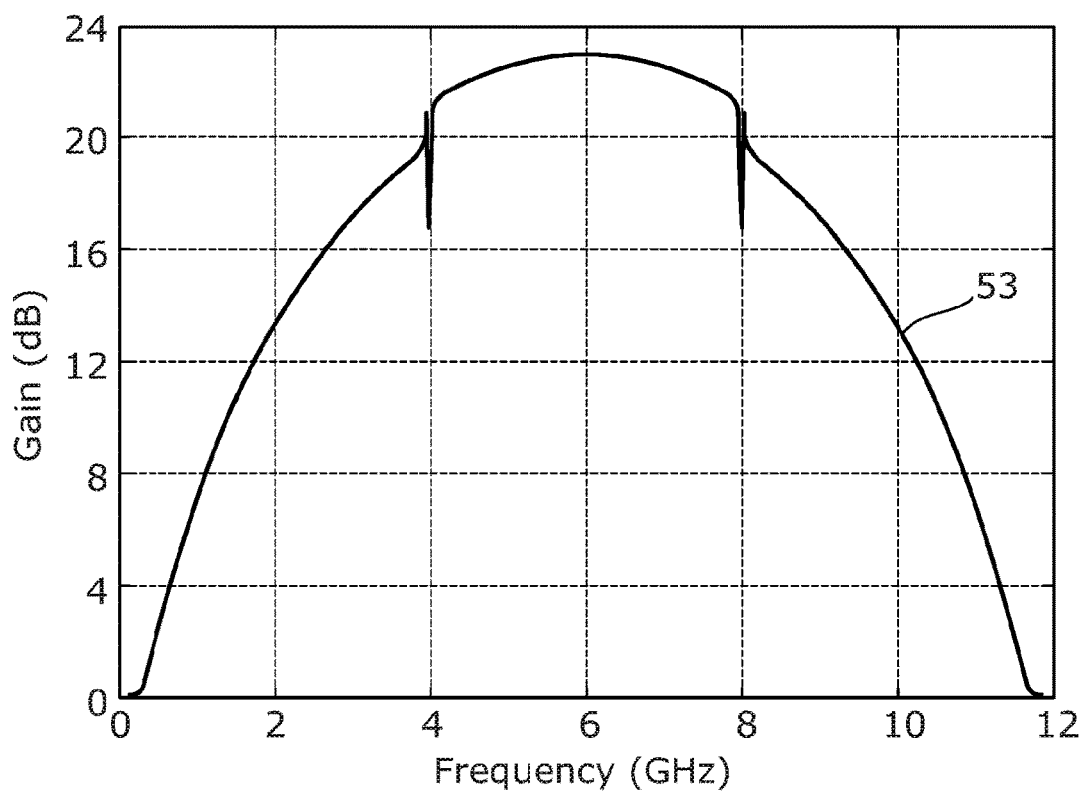
Figure 8:
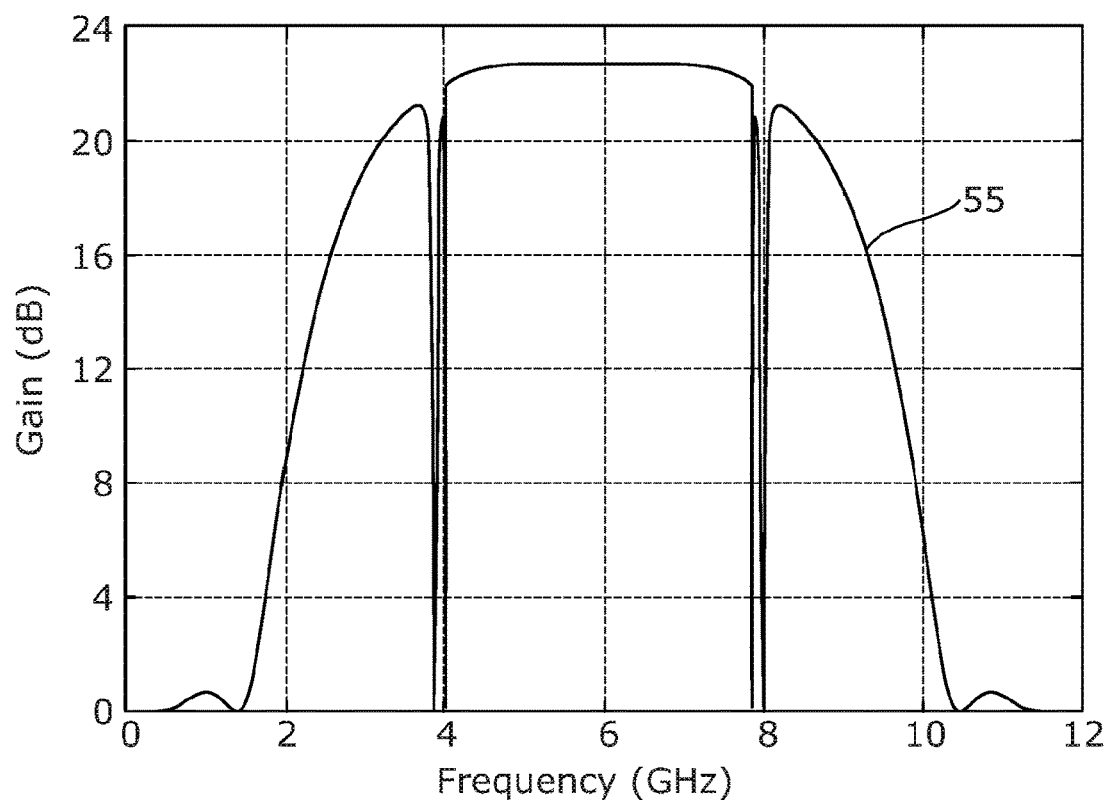
Figure 9A:
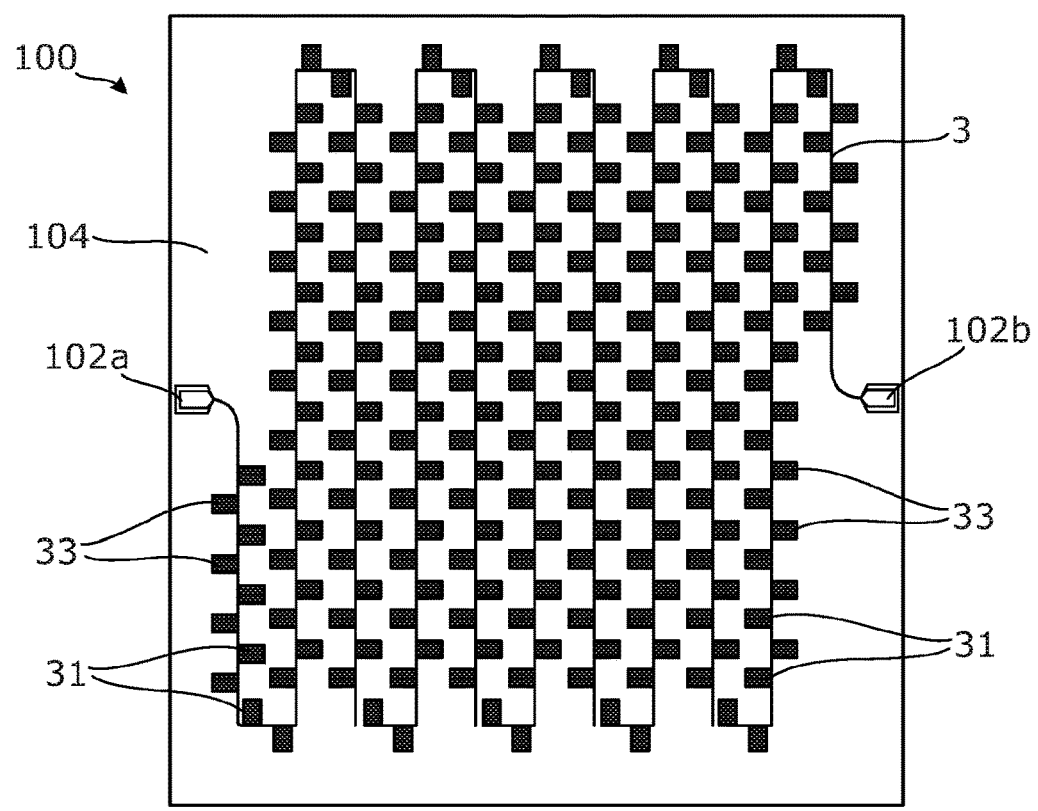
Figure 9B:
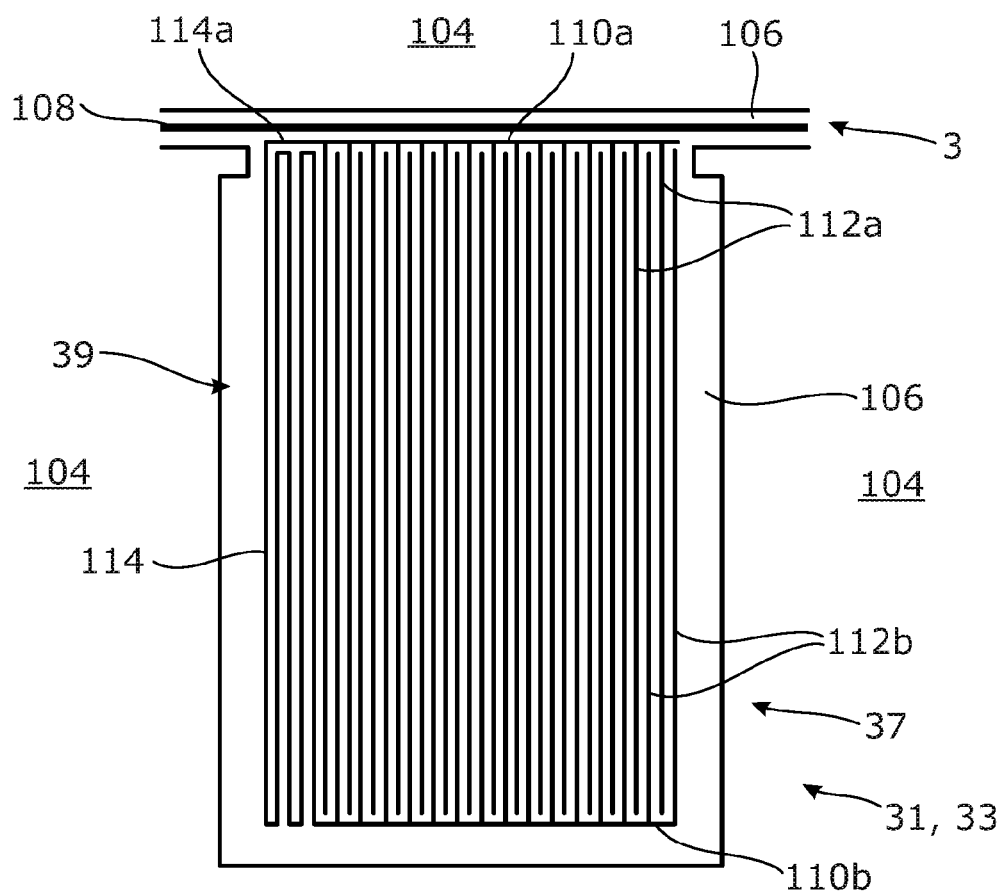
Figure 9C:
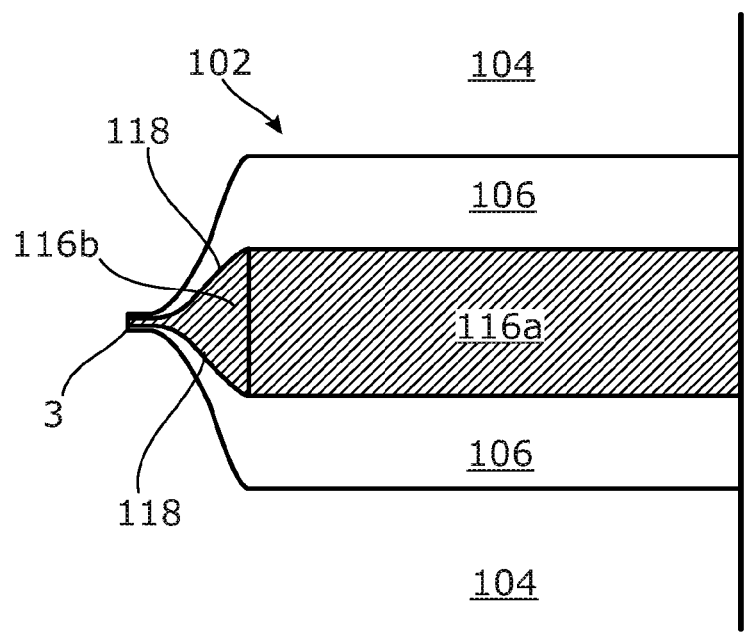
Figure 10:
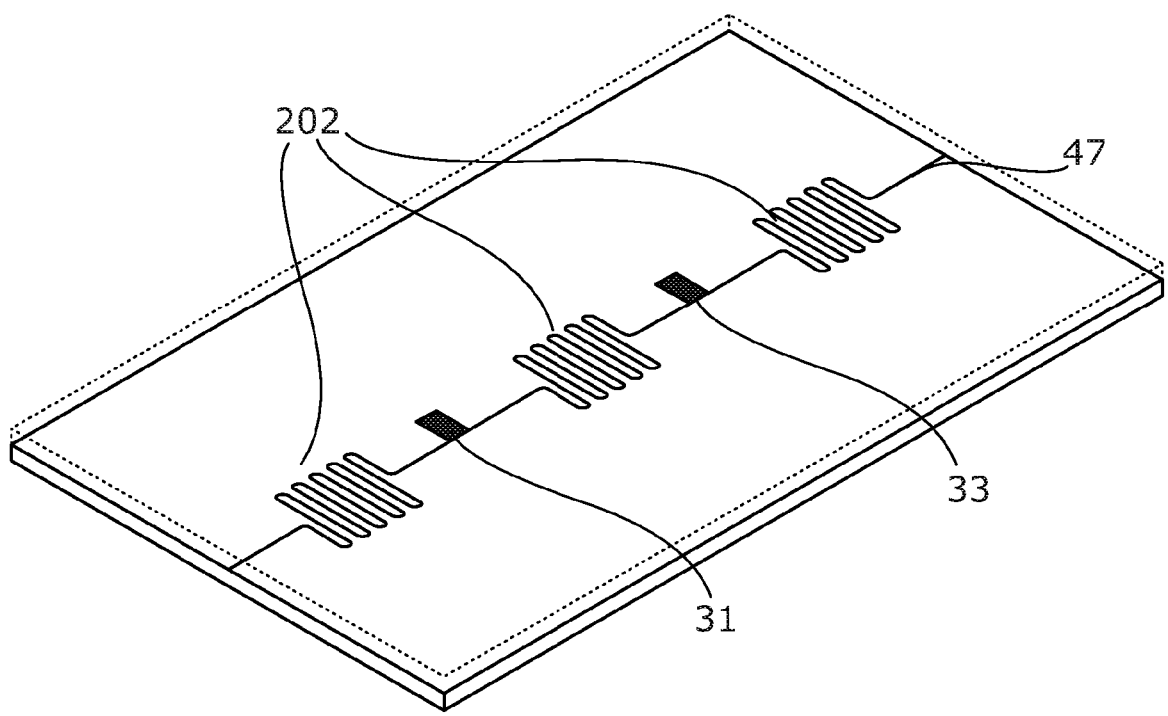
Figure 11A:
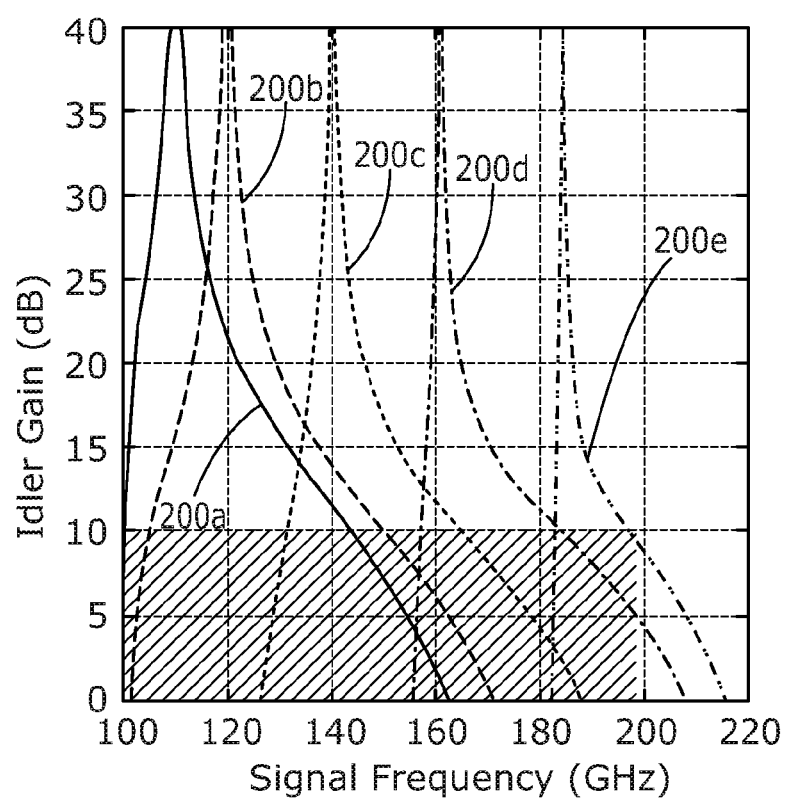
Figure 11B:
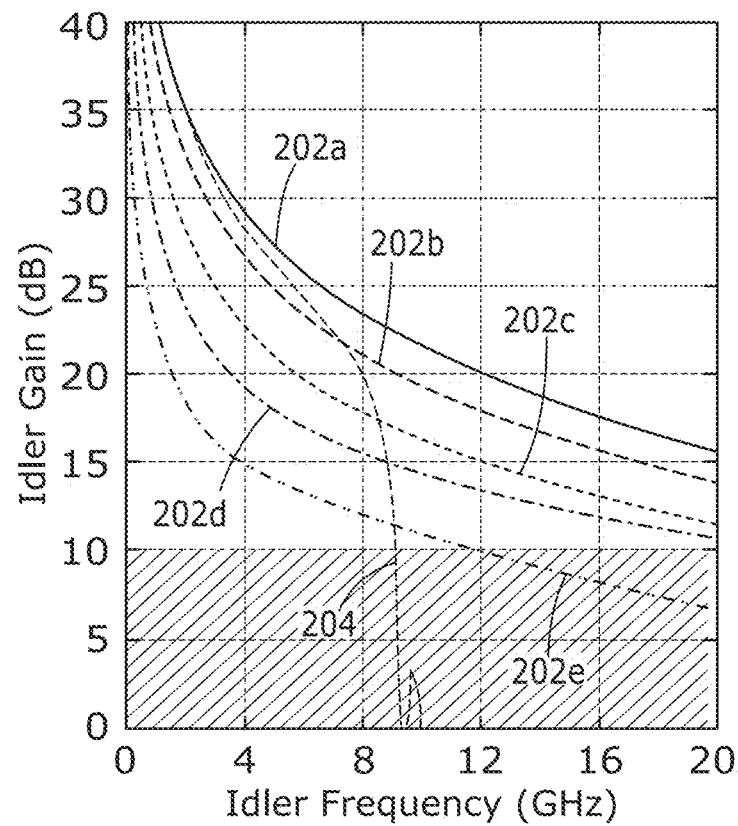
Figure 11C:
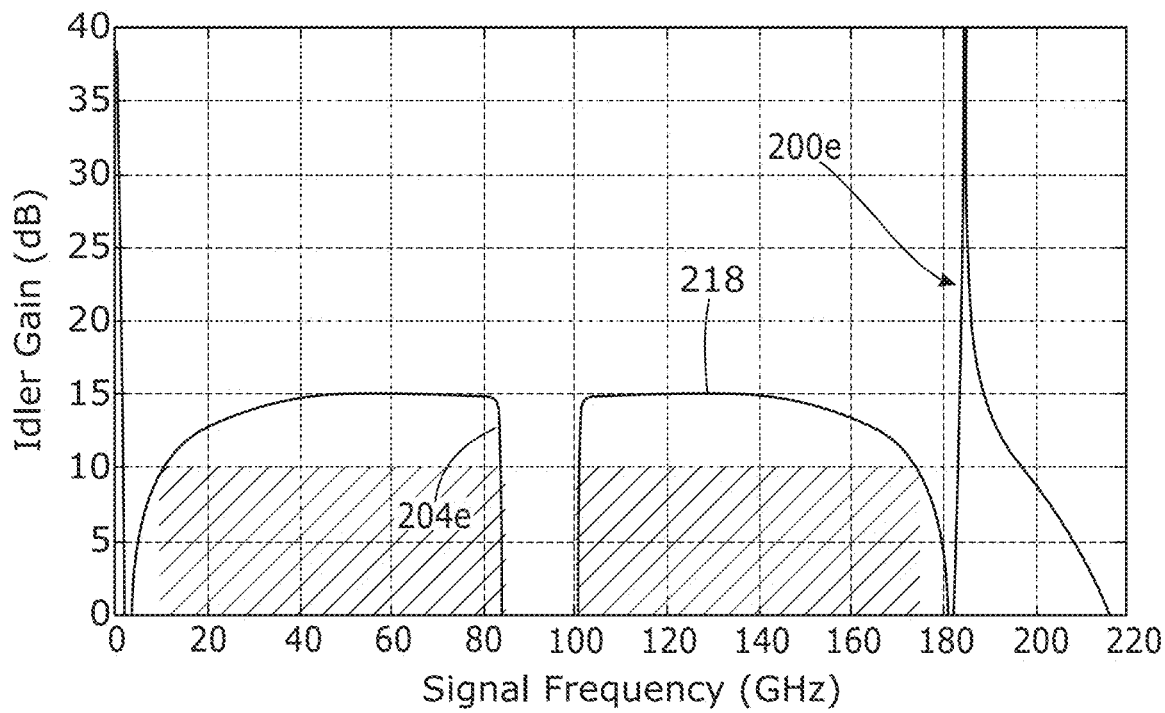
Figure 12A:
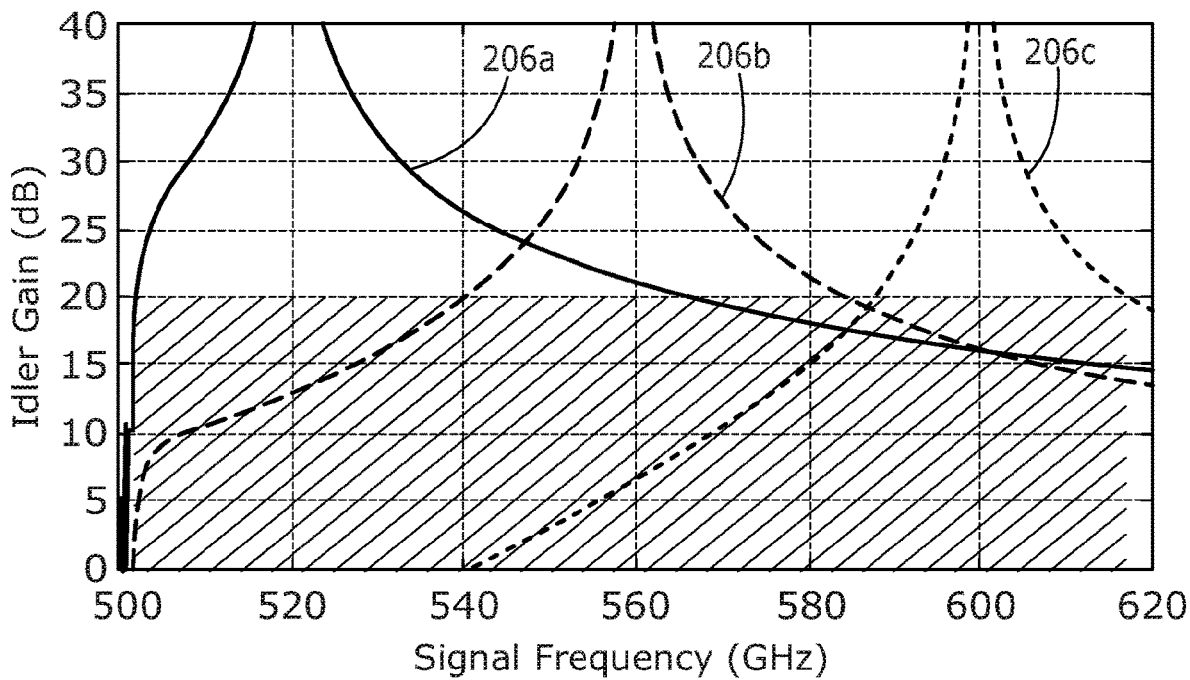
Figure 12B:
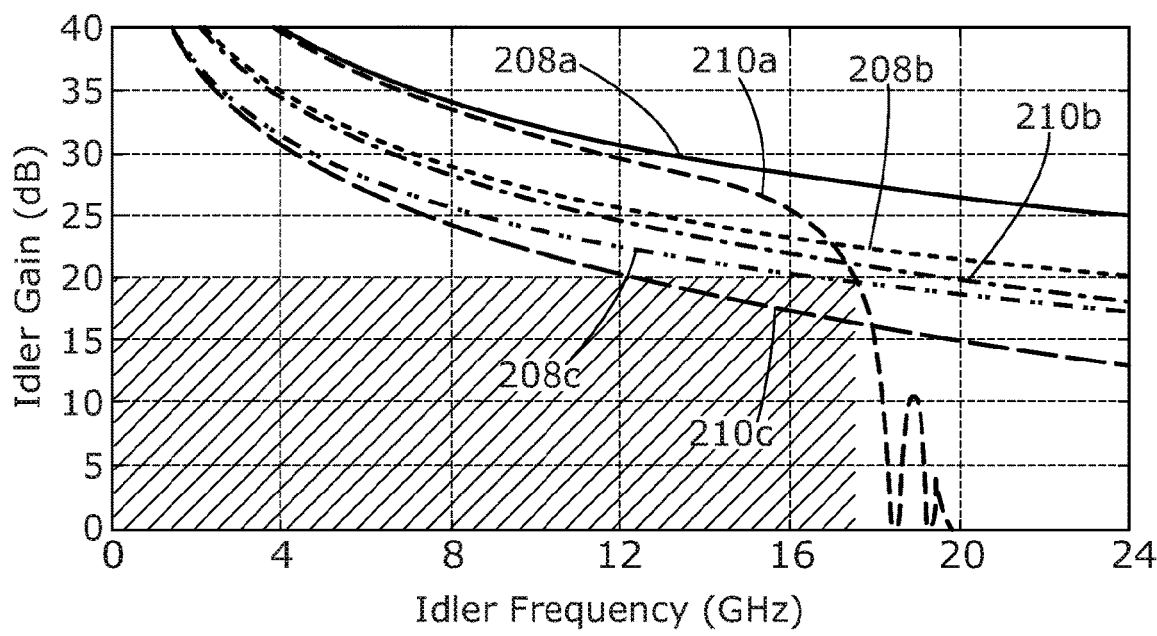

FIG. 5A schematically illustrates the gain profile of an amplifier based on the circuit of 4A;

FIG. 5B shows the variation in the gain profile of FIG. 5A with pump signal amplitude;

FIG. 5C schematically illustrates the gain profile of an alternative amplifier based on the circuit of 4A;

FIG. 6A illustrates a circuit diagram for use in a kinetic inductance travelling wave parametric amplifier;

FIG. 6B illustrates the dispersion relationship of the amplifier based on the circuit of 6A;

FIG. 6C illustrates the dispersion relationship of FIG. 6B, on a modified scale;

FIG. 7 schematically illustrates the gain profile of an amplifier based on the circuit of 6A;

FIG. 8 schematically illustrate the gain profile of a kinetic inductance travelling wave parametric amplifier including resonators to control the dispersion relationship;

FIG. 9A illustrates an example structure for implementing the amplifier of FIG. 4A;

FIG. 9B illustrates a resonator in the structure of FIG. 9A;

FIG. 9C illustrates a bonding contact in the structure of FIG. 9A;

FIG. 10 illustrates an example structure for implementing a kinetic inductance travelling wave parametric amplifier including resonators to control the dispersion relationship;

FIG. 11A illustrates the gain for an idler signal with a resonator at 100 GHz, as a function on input signal frequency;

FIG. 11B illustrates the gain for an idler signal with a resonator at 100 GHz, as a function on idler signal frequency;

FIG. 11C illustrates the gain for an idler signal with a resonator at 100 GHz, as a function on input signal frequency, with a second pump signal at 80 GHz;

FIG. 12A illustrates the gain for an idler signal with a resonator at 500 GHz, as a function on input signal frequency;

FIG. 12B illustrates the gain for an idler signal with a resonator at 500 GHz, as a function on idler signal frequency.

Figure 13A:
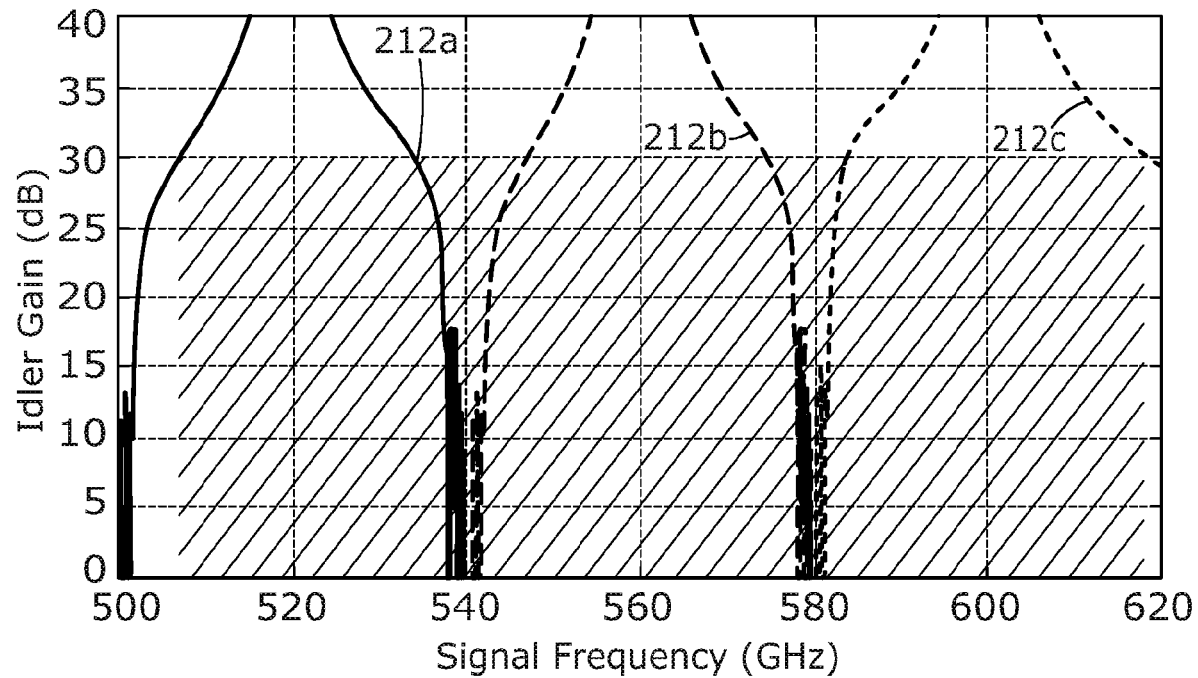
Figure 13B:
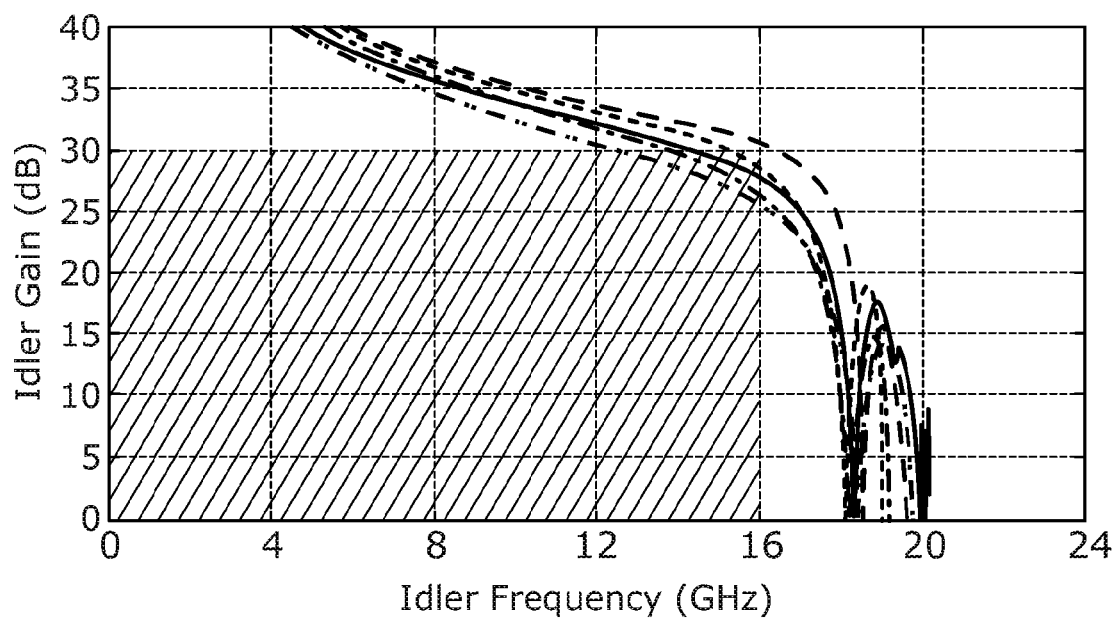
Figure 13C:
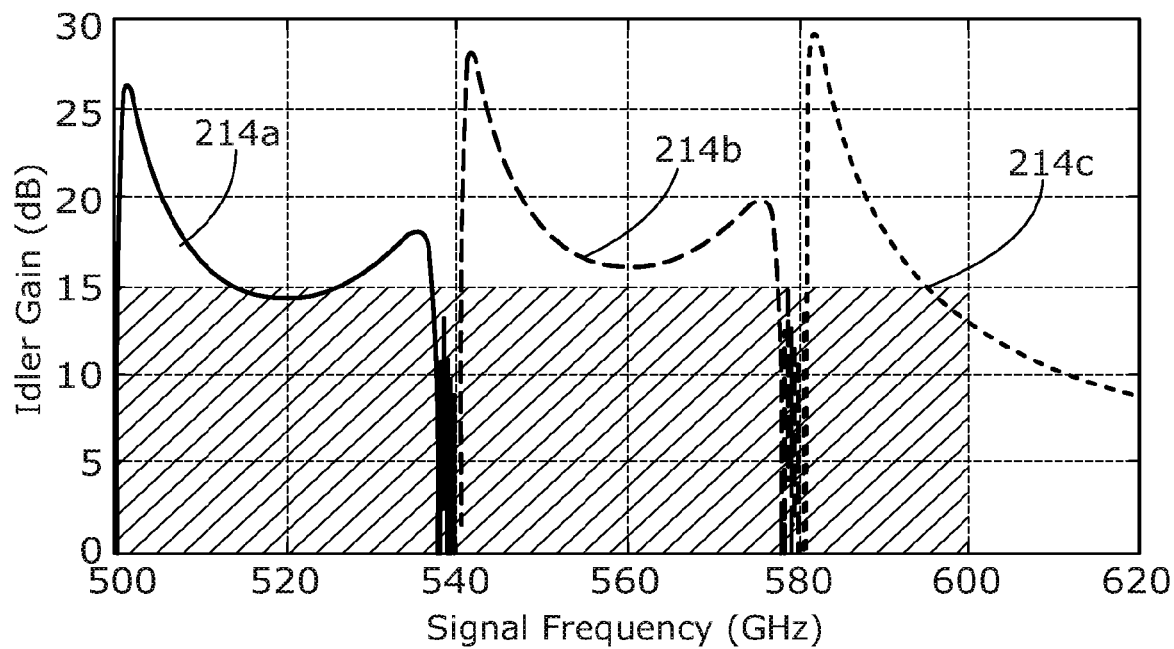
Figure 13D:
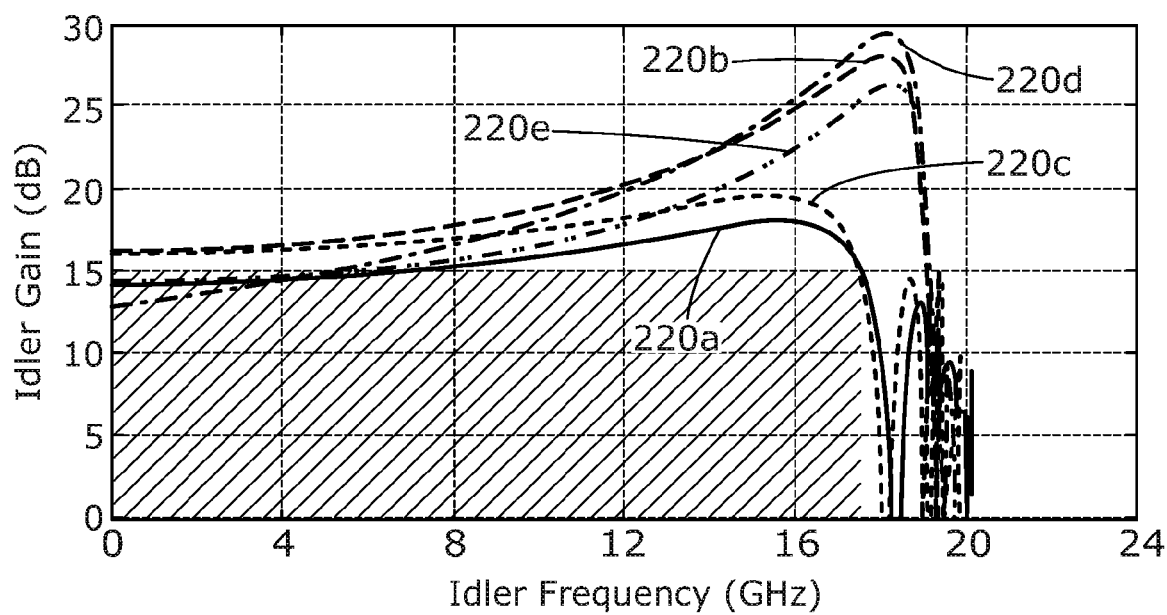
Figure 14A:
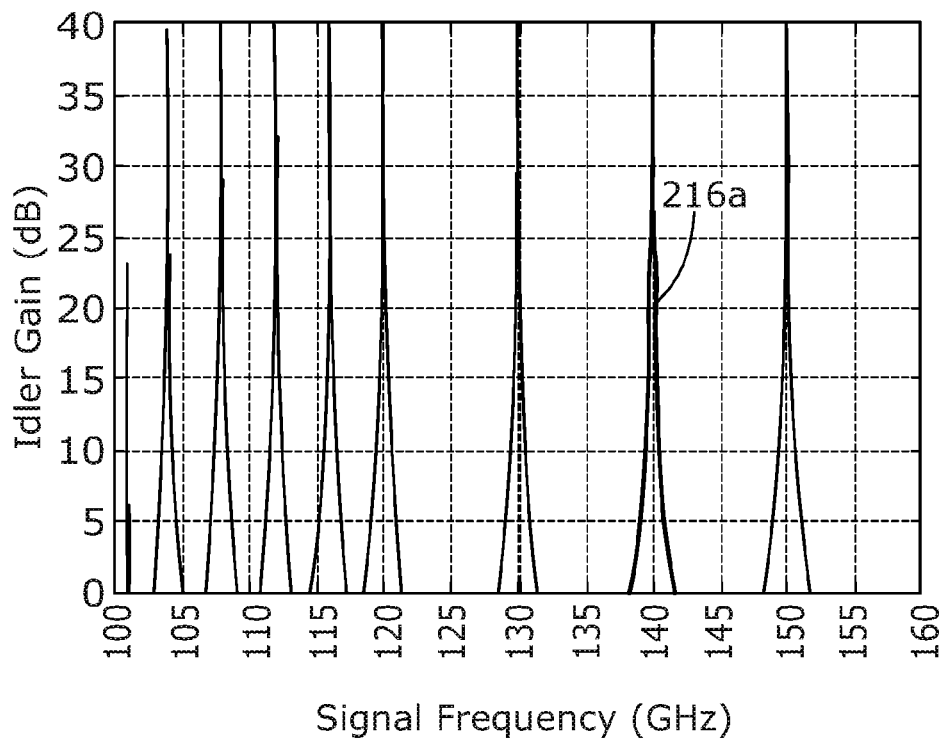
Figure 14B:
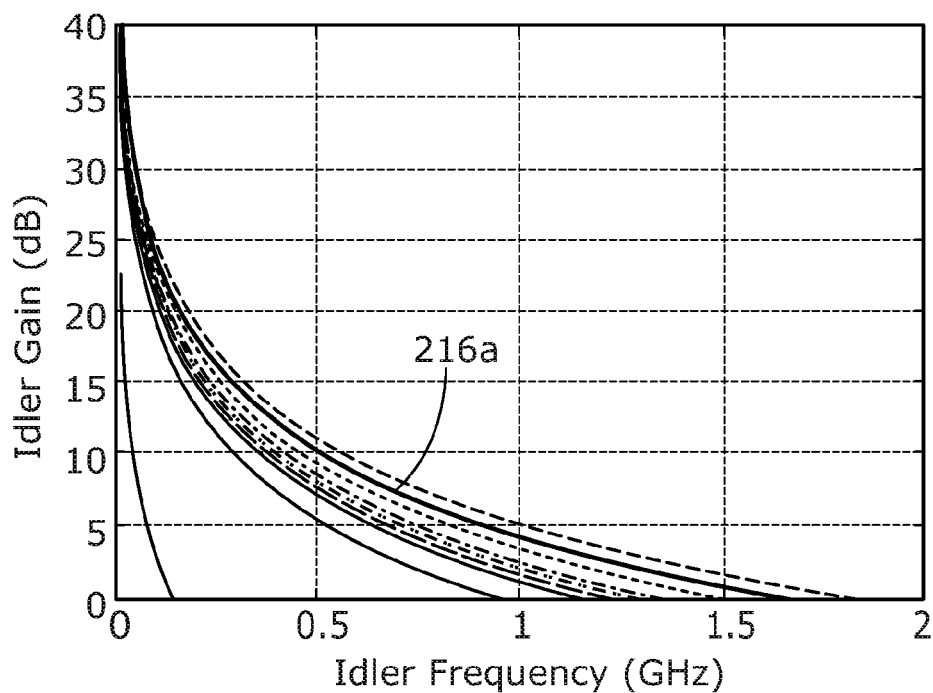

FIG. 13A illustrates the gain for an idler signal with resonators at 500 GHz, 540 GHz and 580 GHz, as a function on input signal frequency;

FIG. 13B illustrates the gain for an idler signal with a resonator at 500 GHz, 540 GHz and 580 GHz, as a function on idler signal frequency;

FIG. 13C illustrates the gain for an idler signal with resonators at 500 GHz, 540 GHz and 580 GHz, as a function on input signal frequency, for alternative pump signal frequencies compared to FIG. 13A;

FIG. 13D illustrates the gain for an idler signal with a resonator at 500 GHz, 540 GHz and 580 GHz, as a function on idler signal frequency, for the pump signal frequencies shown in FIG. 13D;

FIG. 14A illustrates the gain for an idler signal with a resonator at 100 GHz, as a function on input signal frequency, with fixed first pump frequency and a sweep of the second pump frequency;

FIG. 14B illustrates the gain for an idler signal with a resonator at 100 GHz, as a function on idler signal frequency, with fixed first pump frequency and a sweep of the second pump frequency;

FIG. 15A illustrates an example structure for implementing the amplifier of FIG. 6A;

FIG. 15B illustrated a bonding contact of the structure of FIG. 15A in more detail;

FIG. 15C illustrates the transmission line of the structure of FIG. 15A in further detail; and FIG. 15D illustrates the periodic loading of the transmission line of the structure of FIG. 15A in more detail.

Figure 1A:
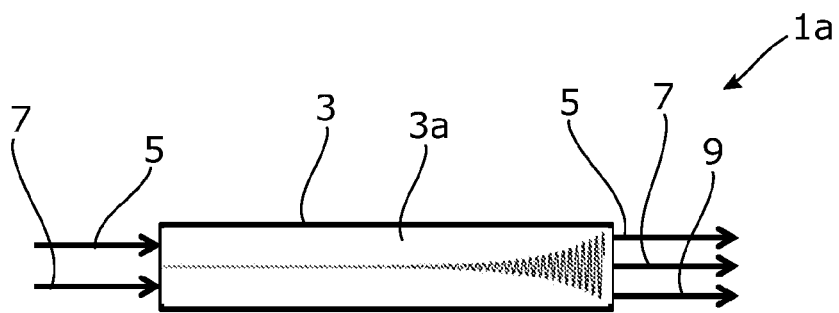

FIG. 1A illustrates an example of a travelling wave parametric amplifier (TWPA) 1a. The TWPA 1a is formed from a transmission line 3. The transmission line 3 is formed from a non-linear medium 3a, so that when an input signal 5 that is to be amplified, and a pump signal 7 pass through the medium 3a, they interact to transfer energy from the pump signal 7 to the input signal 5. The effect of this is to amplify the input signal 5. This is shown schematically within the transmission line 3 in FIG. 1A.

Figure 1B:
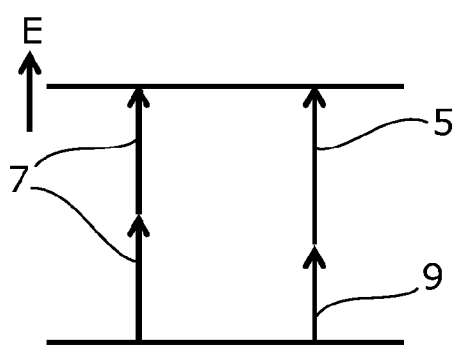

FIG. 1B shows the mixing process that occurs within the non-linear gain medium 3a, when the pump signal 7 mixes with the input signal 5. The process is known as three-wave mixing, and is shown schematically in FIG. 1B.

Conservation of angular momentum means that the total angular momentum at the input must be the same as the total angular momentum at the output. The input signal 5 is at a different frequency to the pump signal, and so has different angular momentum. To account for this difference, an idler signal 9 is generated. The frequency (and hence angular momentum) of the idler signal 9 is the difference between the frequency of the input signal 5 and two times the frequency of the pump signal 7. The generation of the idler 9 is known as spontaneous parametric up or down conversion (depending on the frequency of the idler generated relative to the input signal 5).

At the output of the transmission line 3, there is an amplified input signal 5, a pump signal 7, and the idler signal 9. The pump signal is still present because only a small portion of the energy of the pump signal 7 is transferred to the input signal, and so the pump wave 7 still has significant amplitude. Furthermore, if the amplitude of the pump signal 7 is reduced too much, energy transfer may occur back from the amplified input signal 5 to the pump signal 7, reducing the overall gain. Therefore, the amplitude of the pump signal 7 at the output is reduced compared to its input amplitude, but it is still higher than the amplified input signal 5, to ensure optimum gain.

FIG. 1B also neglects any losses in the medium 3a. Since the medium is low loss or lossless, the losses can be considered negligible.

FIG. 1B illustrates the non-degenerate case, where the idler signal 9 has a different frequency to the input signal 5. The amplifier 1a may also be degenerate, where the idler 9 and input 5 have the same frequency. In this situation, the idler 9 and input 5 are only distinguishable by their amplitude.

In some situations, the transmission line 3 is used as an amplifier, and only the amplified input signal 5 is used. In other examples, the transmission line 3 is used as a signal converter, and the idler signal 9 is used. Depending on the frequency of the pump signal 7 and the input signal 5, the idler signal 9 may be higher frequency than the input signal (up-converter) or lower frequency (down converter). Other, weaker, intermixing harmonics are also generated from the mixing process. In some examples, both the idler 9 and the amplified input signal 5 may be used.

The transmission line 3 may also be used in a number of other different applications, including but not limited to switching, signal sampling, de-multiplexing and pulse generation.

To achieve useful gain levels when amplifying signals of radio frequency to THz, it is necessary to use a medium 3a that is low loss. A medium that is high loss would require high levels of gain to overcome losses in the transmission line 3, and so would not achieve a reasonable level of gain. Materials which are superconducting are one example of a low loss material.

In one example, the transmission line is a line of Josephson Junctions connected in series. Josephson junctions are devices which have two superconducting electrodes separated by a thin layer of non-superconducting material (conductor, insulator or semiconductor). In another example, the transmission line is a wire formed from a long microstrip, coplanar waveguide (CPW), or other transmission line topology, made from a high normal state resistivity (and hence high kinetic inductance) superconductor (i.e. a superconductor that has high resistivity when it is not superconducting).

The Josephson junction based TWPA (JJTWPA) 1a uses the non-linear inductance of the Josephson Junction to amplify the input signal 5. This emulates the Kerr-effect medium found in an optical fibre, which acts as a parametric amplifier for optical wavelengths. The wire based TWPA 1a makes use of the non-linear kinetic inductance of the high normal state resistivity wire to achieve the same effect, and so can be referred to as a kinetic inductance TWPA (KITWPA) 1a.

In the KITWPA and JJTWPA 1a, the medium 3a is a non-linear medium that provides non-linear interaction between waves present in the medium. However, for optimum gain levels, the input signal 5 and pump signal 7 and idler 9 should be phase matched, such that the total difference between all signals in the medium is zero, or nearly zero. The TWPA 1a therefore has to include a means to phase match the input signal 5, pump signal 7 and idler signal 9.

In the case of the JJTWPA 1a, a series of shunt resonators are coupled to the line of Josephson junctions. In the case of the KITWPA 1a, a periodic loading element is provided along the wire. In both cases, the means for phase matching the signal creates a stopband in the dispersion relationship of the medium 3a.

At the stopband, the dispersion relationship asymptotically tends to infinity. At the central frequency of the stopband, there is infinite dispersion. When the pump signal 7 has a frequency near the stopband, so that the dispersion of the pump signal 7 at this frequency ensures that the total phase mismatch is zero or close to zero, for a range of input signal frequencies. However, when the input signal 5 is at the central frequency of the stopband, the input signal 5 cannot propagate down the transmission line, and there is no signal at the output, and therefore no gain. Furthermore, the gain quickly falls away as the input signal varies from the frequency of the stopband, as the phase mismatch increases.

Figure 1C:
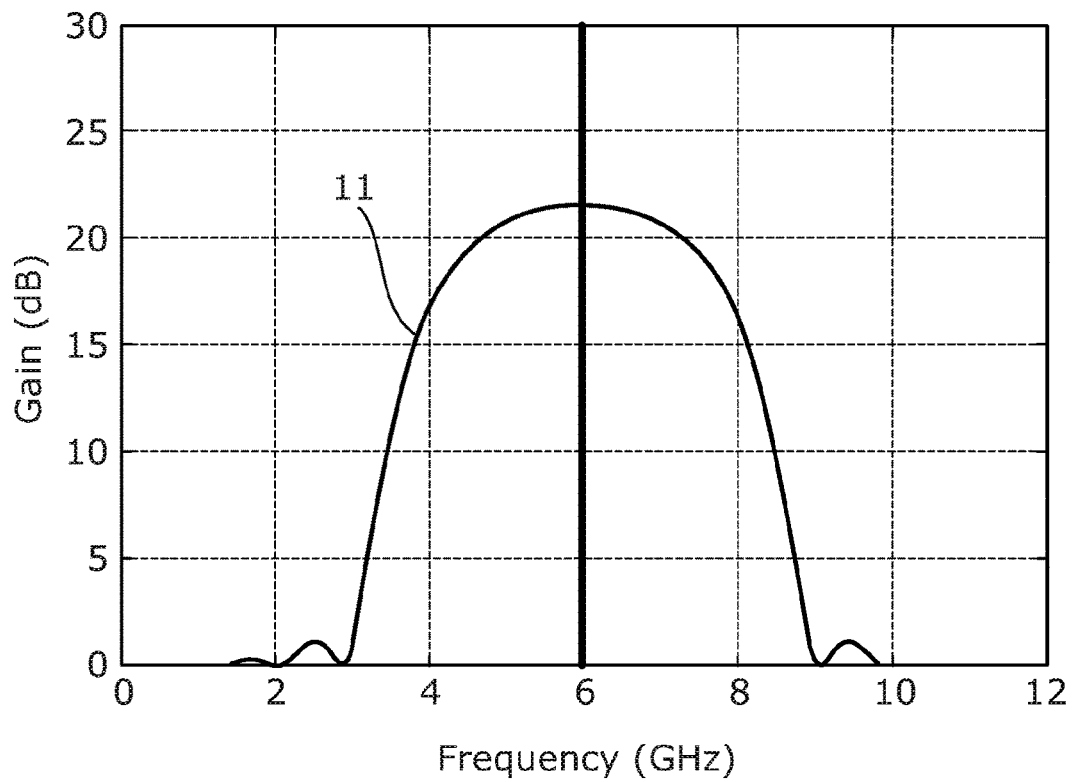
Figure 1D:
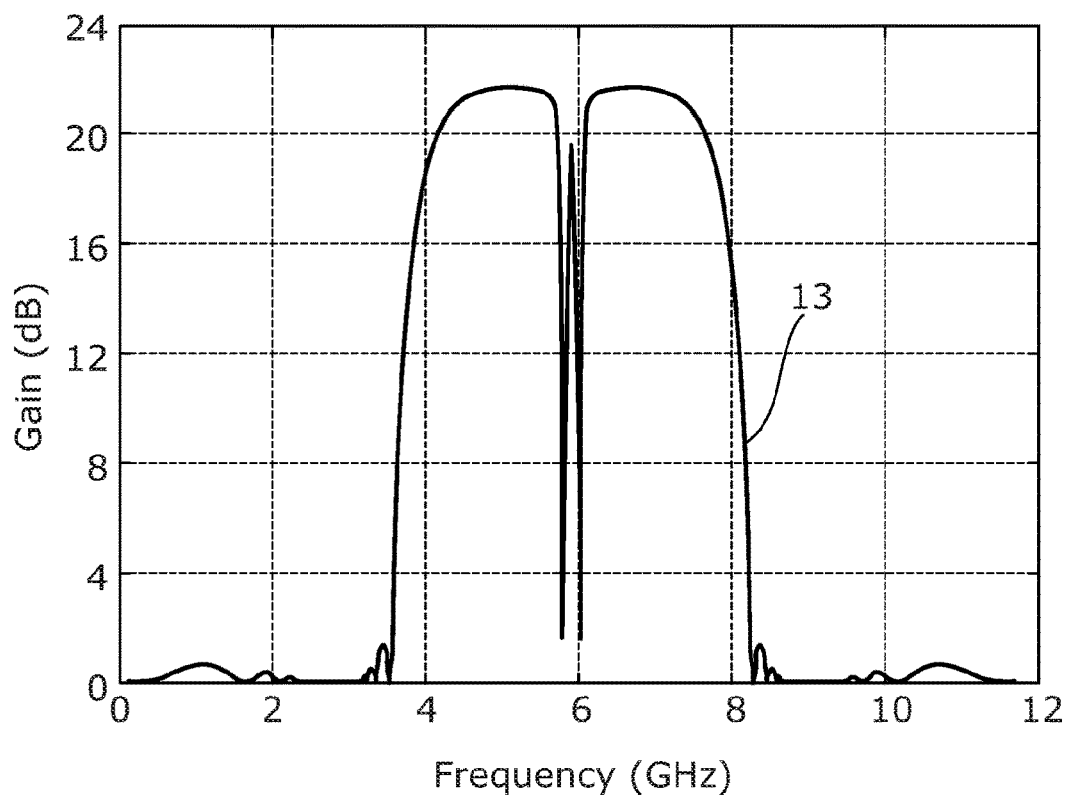

This is shown by FIGS. 1C and 1D, which show the gain profile as a function of input signal frequency for a JJTWPA 11 and a KITWPA 13 respectively. As can be seen, there is a region in the centre of the operating bandwidth where there is no gain, and the gain quickly falls away from the centre of the operating bandwidth. The width of the region is determined by the pump frequency, the width of the stopband, and the Q-factor of the resonators or the periodic loading regions, and the variation in dimension of these resonators or periodic loading in actual fabrication process.

As can be seen more clearly in FIG. 1D, although it is present in both cases, region with no gain is formed of two regions close together in frequency. The first region is formed when the input signal 5 is at the same frequency as the stopband, and no signal can propagate down the transmission line. The second region is when the input signal 5 is at the same frequency as the pump signal 7, and the dispersion of the input signal increases, and so the phase does not match.

Figure 2A:
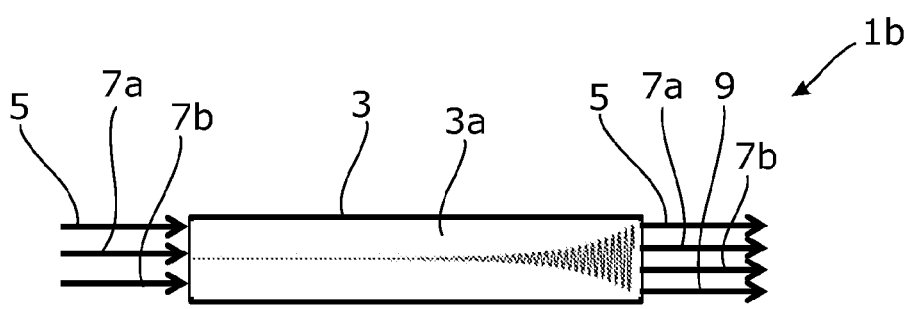

FIG. 2A shows a second schematic example of a TWPA 1b. As with the example in FIG. 1A, the TWPA 1b is formed from a transmission line 3, comprising a non-linear medium 3a. In the example shown in FIG. 2A, two different pump signals 7a, 7b are provided into the transmission line 3. The pump signals 7a, 7b have different frequencies, but similar or identical intensities.

Figure 2B:
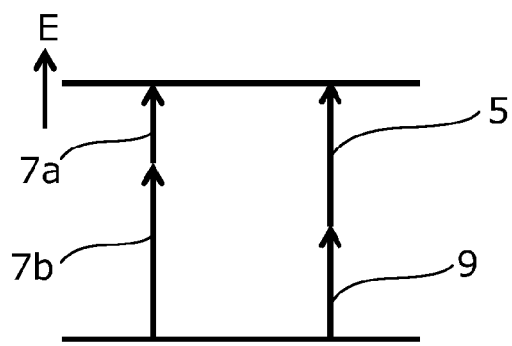

FIG. 2B shows the relationship between the energy of the pump signals 7a,b, the input signal 5 and the idler signal 9. Energy is transferred from both pump signals 7a, 7b, to the input signal 5, which is amplified, as shown schematically in FIG. 2A. Once again, to ensure conservation of angular momentum, an idler signal 9 is generated. The frequency of the idler signal 9 is the difference between the frequency of the input signal 5 and pump signals 7a, 7b. The dual pump TWPA 1b is an example of four wave mixing. Other higher order inter-mixing harmonics will also be generated during this mixing process, although at a much lower amplitude.

As with the single pump example, only a small portion of the energy of the pump wave 7a,b is converted. Therefore, at the output of the transmission line 3, there is an amplified input signal 5, a pair of pump signals 7a, 7b, and the idler signal 9. As with the single pump 1a example, either the amplified input signal 5 and/or the idler signal 9 and/or the other inter-mixing harmonics may be used. Depending on the frequency of the pump signals 7a, b and the input signal 5, the idler signal 9 may be higher frequency than the input signal 5 (up-converter) or lower frequency (down converter).

Figure 3:
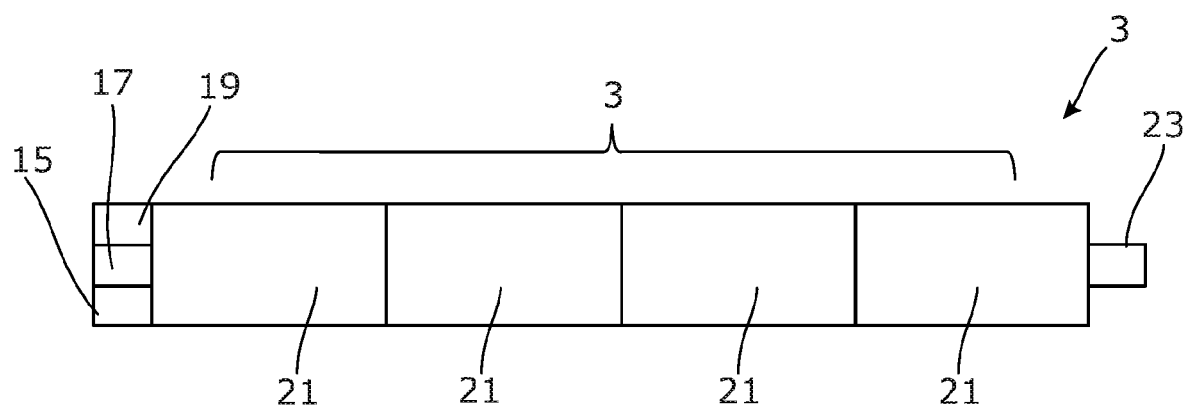

The dual pump amplifier 1b can be implemented as a JJTWPA or a KITWPA. FIG. 3 shows a schematic example of the structure of a transmission line 3 for a dual pump TWPA 1b. The dual pump TWPA 1b includes a signal input 15, for receiving the signal to be amplified 5, a first pump input 17 for receiving the first pump signal 7a, and a second pump input 19 for receiving the second pump signal 7b.

As will be discussed below in more detail, the transmission line 3 is formed from a periodic structure having a plurality of repeating unit cells 21 of identical structure. In the example shown, there are four of the unit cells 21. However, it will be appreciated that the transmission line 3 can contain any number of unit cells 21. For example, the transmission line may be composed of one, tens, hundreds, thousands or more of the unit cells 21.

The dual pump TWPA 1b also includes an output 23. In some examples, the output 23 can be used to transfer the amplified input signal 5, pump signals 7 and idler signal 9 to a subsequent device for later processing (not shown). Unwanted components of the output (for example the pump signals) can be filtered out. Alternatively, the output 23 may be connected to a spectrum analyser (not shown) to read the amplitude and/or phase and/or frequency of all the signal components.

In other examples, where the amplified signal 5 and/or the idler signal 9 are to be provided for further use, the output 23 includes filters (not shown) to remove the pump signals 7a, 7b. Where only the amplified input signal 5 is to be used, the output 23 also includes a filter (not shown) to remove the idler signal 9. Where only the idler signal 9 is to be used, the output 23 includes a filter (not shown) to filter out the amplified input signal 5. Where both the idler 9 and amplified input signal 5 are to be used, a second output (not shown) is provided. In this case, the amplifier 1b may also include a separator (not shown), to separate the amplified output signal 5 and the idler 9.

As with the single pump version, optimum gain is achieved in the dual pump TWPA 1b when the pump signals 7a, 7b, input signal 5 and idler signal are phase matched.

In this case, the means for phase matching the signal is arranged to create a pair of stopbands in the dispersion relationship, a first stopband occurring at a first frequency, and a second stopband occurring at a second, different frequency in the dispersion relationship. A first pump signal 7a is operated at a first pump frequency near the frequency of the first stopband, and the second pump signal 7b is operated at a second pump frequency near the frequency of the second stopband. The pumps cannot be operated exactly at the frequencies of the stopbands, since no waves can propagate down the transmission line 3 in the stopband.

As with the single pump TWPA 1a, the gain profile of the dual pump TWPA 1b has regions with no or low gain at the same frequencies as the stopbands. As discussed above, each region has two separate parts, one where the frequency of the input signal 5 approaches the frequency of the stopband, and the other where the frequency of the input signal 5 approaches the frequency of the pump signal 7a, b.

However, between the regions of no gain, the gain can be controlled such that it is relatively constant and stable. This means that the dual pump amplifier 1b has an operational bandwidth, between the frequencies of the first and second stopbands or pump frequencies, and does not have any region of no gain within the operational bandwidth.

In this case, the operational bandwidth is slightly less than the bandwidth defined by the stopbands or pump frequencies. This is because the gain gradually decreases near the regions of no gain. This decrease occurs over a relatively short range of frequencies, compared to the overall operational bandwidth. Therefore, the operational bandwidth extends from a minimum frequency, just above the first stop frequency or pump frequency, to a maximum frequency, just below the second stop frequency or pump frequency. The operational bandwidth is considered to be the bandwidth over which the gain stays above a desired threshold amount. For example, the operational bandwidth may be region over which the gain is at most 3 dB below the maximum (50% of the maximum gain).

FIG. 4A shows the circuit diagram for the unit cell 21 in a dual pump JJTWPA 1b. A first set of three Josephson Junctions 23a, 23b, 23c are provided in series, followed by a second set of three Josephson Junctions 27a, 27b, 27c, also connected in series. The Josephson junctions in the first set 23a,b,c are the same as the Josephson junctions in the second set 27a,b,c. Shunt capacitors 25a,b,c, 29a,b,c are provided between each of the Josephson Junctions 23a,b,c, 27a,b,c to a common earth line 41 of the circuit.

The circuit includes a first shunt resonator 31, connected to the common earth line 41, between the first set of Josephson junctions 23a,b,c and the second set of Josephson junctions 27a,b,c, and a second shunt resonator 33, connected to the common earth line 41 after the second set of Josephson junctions 27a,b,c.

The first resonator 31 has a first resonant frequency and is used to form a first stopband in the dispersion relationship. Similarly, the second resonator 33 has a second resonant frequency and is used to form a second stopband in the dispersion relationship. The first stopband is at a first stop frequency, and the second stopband is at a second stop frequency. The frequencies of the stopbands are the same as the resonant frequencies of the resonators 31, 33.

The resonators 31, 33 are formed of an LC resonator circuit, including a resonator capacitor 37, and a resonator inductor 39. The coupling capacitances of the resonators 31, 33 to the Josephson junctions are represented by a capacitor 35. The resonant frequency of the resonator 31, 33 can primarily be tuned by selection of the resonator capacitor 37, and the resonator inductor 39, although the parameters of the Josephson junctions 23a,b,c, 27a,b,c, shunt capacitors 25a,b,c, 29a,b,c and coupling capacitance 35 can also affect the resonant frequency.

Figure 4B:
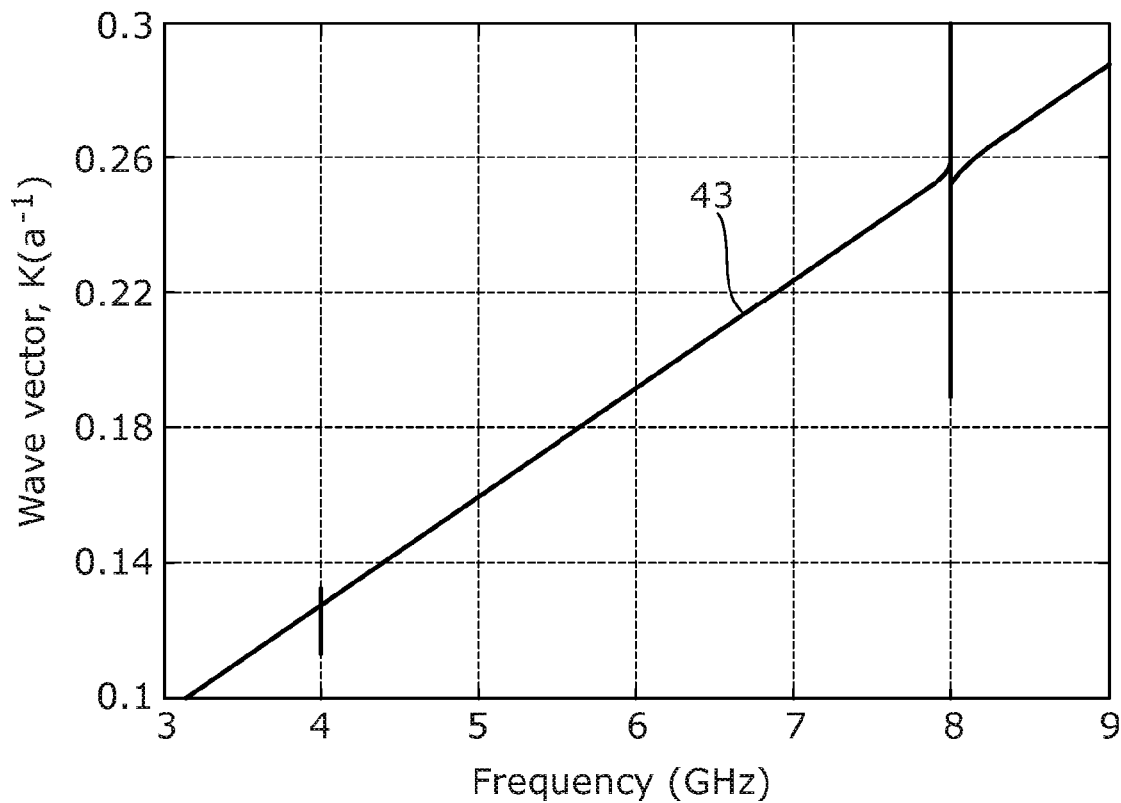
FIG. 4B illustrates the dispersion relationship of the amplifier based on the circuit of 4A.
Figure 4C:
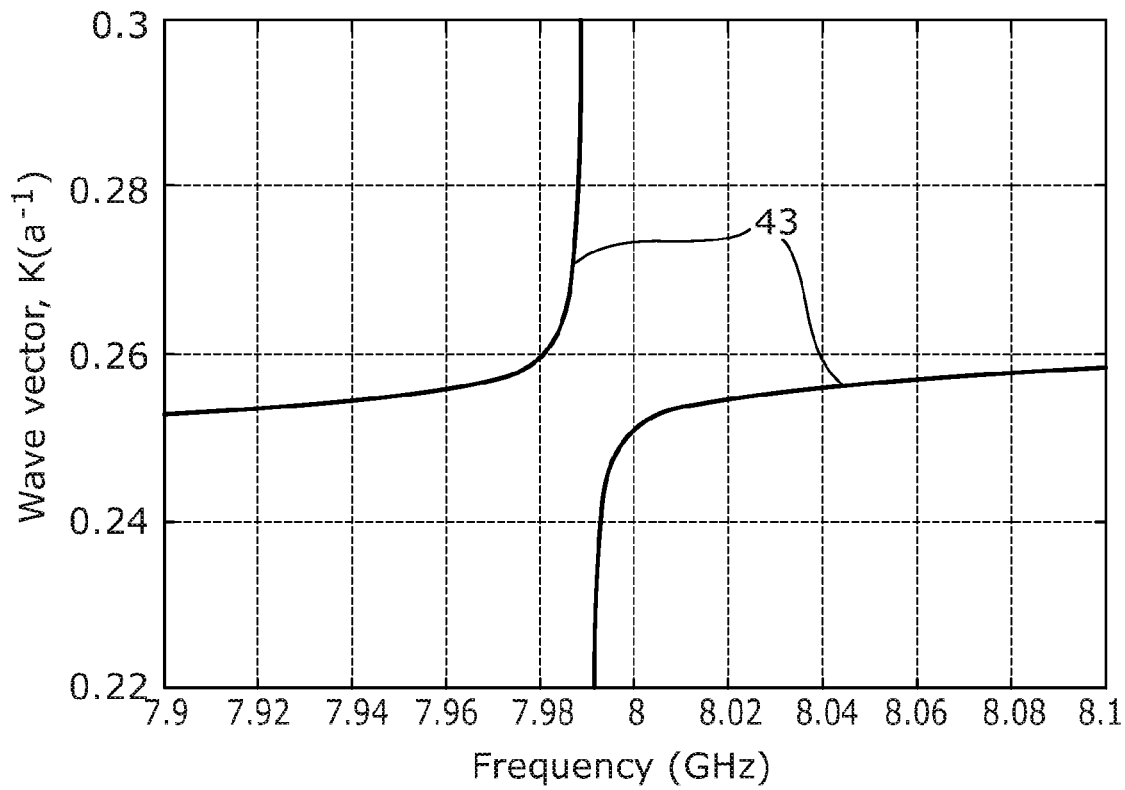
FIG. 4C illustrates the dispersion relationship at one of the stopbands in FIG. 4B.

FIG. 4B shows the dispersion relationship modelled for a dual pump JJTWPA 1b. The dispersion relationship is generally linear, with two stopbands at different frequencies to each other. FIG. 4C shows the stopband at 8 GHz in more detail. As can be seen, near the resonant frequency of the resonator 31, 33, the dispersion relationship starts to curve away from the linear relationship, until it reaches infinite dispersion as the resonant frequency of the resonator. The dispersion relation can thus be descried as tending asymptotically to infinity at the resonant frequency of the resonator 31, 33. The dispersion at the stopband at 4 GHz also tends to infinity, but this cannot be seen on the scale.

As discussed above, the pump signals 7a,b cannot be operated at exactly the frequencies of the stopbands. However, they should be operated at a frequency where the dispersion relationship has tended away from the linear, in order to provide phase matching actions.

The dispersion relationship in FIGS. 4B and 4C shows the general features of the dispersion relationship for a JJ embedded transmission line 3 including resonators with 31, 33 with two different resonant frequencies. The specific example has been modelled based on the circuit described in relation to FIG. 3, with 5000 repeating unit cells 21. The Josephson junctions 23, 27 are modelled to have critical current of $I_*=3.29$ micro Amps, capacitance 329 pF, and inductance 100 pH. The shunt capacitances 25a,b,c, 29a,b,c of the Josephson junction are set to be 39 pF. The coupling capacitance 35 in the resonator 31, 33 is assumed to be 10 pF. The resonator inductor 39 of both resonators 31, 33 is given an inductance of 100 pH. The first resonator capacitor 37a is set at 15.831 pF, and the second resonator capacitor 37b is set at 3.985 pF.

Based on the above parameters, the first resonator 31 has a resonant frequency of approximately 4 GHz, and the second resonator 33 has a resonant frequency of approximately 8 GHz. This can be seen at the stopbands on FIG. 4B. Between the stopbands, the dispersion relationship is roughly linear. This is the intrinsic dispersion relationship of the transmission line 3. The intrinsic dispersion relationship is modified by the stopbands, and the dispersion relationship without the effect of the stopbands can be seen by interpolation of the dispersion relationship at frequencies between the stopbands, so that it extends across the stopbands.

FIG. 5A shows the gain profile modelled for a dual pump JJTWPA 1b having the dispersion relationship shown in FIG. 4A. The profile shows the gain as a function of the frequency of the input signal 5. The first pump 7a is set at 3.97 GHz, and the second pump 7b at 7.94 GHz. Both pumps have a current of 0.090 $I_*$.

Using a first principles model for the non-linear dynamics in the Josephson junction transmission line 3, and by making the ansatz that the solutions are travelling waves, together with the slowly varying envelope approximation, and neglecting pump depletion, a set of coupled wave equations which describe the energy exchange between the pump signals 7a, 7b, the input signal 5, and the idler signal 9 can be obtained. These equations provide one example of a model, which can be used to illustrate the effect of the dual pump JJTWPA 1b.

The non-linear wave equation for a JJTWPA 1b can be described as:

$$C_0 \frac{\partial^2 \phi}{\partial t^2} - \frac{a^2}{L} \frac{\partial^2 \phi}{\partial x^2} - C_j a^2 \frac{\partial^4 \phi}{\partial x^2 \partial t^2} = \frac{a^4}{2I_0^2 L^3} \frac{\partial^2 \phi}{\partial x^2} \left(\frac{\partial \phi}{\partial x}\right)^2 \quad (1)$$

Where a is the length of the repeating unit 21.
The solutions are assumed to be forward propagating waves of the form:

$$\phi = \frac{1}{2}\left[A_{p1}(x)e^{i(k_{p1}x+\omega_{p1}t)} + A_{p2}(x)e^{i(k_{p2}x+\omega_{p2}t)} + A_s(x)e^{i(k_sx+\omega_st)} + A_i(x)e^{i(k_ix+\omega_it)} + c.c\right] \quad (2)$$

Where c.c. is the complex conjugate of the first four expressions in the equation. $A_m$ is the slowly varying amplitude for signal m, $k_m$ is the wave vector for the signal m and $\omega_m$ is the angular frequency of the signal m, with m="p1" for the first pump 7a, "p2" for the second pump 7b, "s" for the input signal 5 and "i" for the idler 9.

It is assumed that the second derivatives of the slowly varying amplitude are neglected using the approximation of equation 3a, and the first derivatives of the slowly varying amplitude on the right side of the non-linear wave equation are neglected using the approximation of equation 3b.

$$\left|\frac{d^2 A_m}{dx^2}\right| << \left|k_m \frac{dA_m}{dx}\right| \quad (3a)$$

$$\left|\frac{dA_m}{dx}\right| << |k_m A_m| \quad (3b)$$

Furthermore, the wave vector is defined as shown in equation 4a, allowing equation 1 to be simplified as equation 4b.

$$k_m = \frac{\omega_m \sqrt{C_0 L}}{\sqrt[a]{1 - C_j L \omega_m^2}} \quad (4a)$$

$$\frac{-iC_0 \omega_m^2}{k_m} \frac{\partial A_m(x)}{\partial x} e^{i(k_m x + \omega_m t)} = \frac{a^4}{2I_0^2 L^3} \frac{\partial^2 \phi}{\partial x^2}\left(\frac{\partial \phi}{\partial x}\right)^2 \quad (4b)$$

Equation 4a can also be used to determine the dispersion relationship of the transmission line 3. In one example, the effect of the resonators 31, 33 can be incorporated using the transfer equation of the circuit.

Equation 2 can be substituted into equation 4b, and the terms that oscillate at the different pump 7a,b, input signal 5 and idler 9 frequencies can be separated out to give the following coupled equations:

$$\frac{\partial A_{p1}(x)}{\partial x} - \frac{ia^4 k_{p1}^3}{16 C_0 I_0^2 L^3 \omega_{p1}^2} A_{p1}(x)[k_{p1}^2 A_{p1}(x) A_{p1}^*(x) + 2k_{p2}^2 A_{p2}(x) A_{p2}^*(x)] = 0 \quad (5a)$$

$$\frac{\partial A_{p2}(x)}{\partial x} - \frac{ia^4 k_{p2}^3}{16 C_0 I_0^2 L^3 \omega_{p2}^2} A_{p2}(x)[k_{p2}^2 A_{p2}(x) A_{p2}^*(x) + 2k_{p1}^2 A_{p1}(x) A_{p1}^*(x)] = 0 \quad (5b)$$

$$\frac{\partial A_s(x)}{\partial x} - i\frac{a^4 k_s}{16 C_0 I_0^2 L^3 \omega_s^2}[2k_{p1}^2 k_s^2 A_{p1} A_{p1}^* A_s + 2k_{p2}^2 k_s^2 A_{p2} A_{p2}^* A_s + k_{p1} k_{p2} k_i (k_i - k_{p1} - k_{p2}) A_{p1} A_{p2} A_i^* e^{i\Delta k_L x}] = 0 \quad (5c)$$

$$\frac{\partial A_i(x)}{\partial x} - i\frac{a^4 k_i}{16 C_0 I_0^2 L^3 \omega_i^2}[2k_{p1}^2 k_i^2 A_{p1} A_{p1}^* A_i + 2k_{p2}^2 k_i^2 A_{p2} A_{p2}^* A_{si} + k_{p1} k_{p2} k_s (k_s - k_{p1} - k_{p2}) A_{p1} A_{p2} A_s^* e^{i\Delta k_L x}] = 0 \quad (5d)$$

Assuming no losses, the propagation equation for the pump fields 7a,b can be solved as:

$$A_{p1}(x) = A_{p1}(0) e^{i(\alpha_{p11} + \alpha_{p12})x}$$

$$A_{p2}(x) = A_{p2}(0) e^{i(\alpha_{p21} + \alpha_{p22})x}$$

Where the coupling coefficients are defined as:

$$\alpha_{p11} = \frac{\kappa_{p1} k_{p1}^3 a^2}{L C_{0,p1} \omega_{p1}^2}, \quad \alpha_{p12} = \frac{2\kappa_{p2} k_{p1}^3 a^2}{L C_{0,p1} \omega_{p1}^2}, \quad \kappa_{p1} = \frac{a^2 k_{p1}^2 A_{p1}(0) A_{p1}^*(0)}{16 I_0^2 L^2}$$

$$\alpha_{p12} = \frac{\kappa_{p2} k_{p2}^3 a^2}{L C_{0,p2} \omega_{p2}^2}, \quad \alpha_{p22} = \frac{2\kappa_{p1} k_{p2}^3 a^2}{L C_{0,p2} \omega_{p2}^2}, \quad \kappa_{p1} = \frac{a^2 k_{p2}^2 A_{p2}(0) A_{p2}^*(0)}{16 I_0^2 L^2}$$

Substituting the pump fields into equation 5 for the signal and idler fields gives:

$$\frac{\partial A_s}{\partial x} - i\alpha_s A_s - i\kappa_s A_i^* e^{i(\Delta k_L + \alpha_{p1} + \alpha_{p2})x} = 0$$

$$\frac{\partial A_i}{\partial x} - i\alpha_i A_i - i\kappa_i A_s^* e^{i(\Delta k_L + \alpha_{p1} + \alpha_{p2})x} = 0$$

Where the coupling coefficients are defined as:

$$\alpha_s = \frac{2 k_s^3 a^2}{L C_{0,s} \omega_s^2}(\kappa_{p1} + \kappa_{p2}),$$

$$\kappa_s = \frac{a^4 k_s}{16 C_{0,s} I_0^2 L^3 \omega_s^2}[k_{p1} k_{p2} k_i (k_i - k_{p1} - k_{p2}) A_{p1}(0) A_{p2}(0)]$$

$$\alpha_i = \frac{2 k_i^3 a^2}{L C_{0,i} \omega_i^2}(\kappa_{p1} + \kappa_{p2}),$$

$$\kappa_i = \frac{a^4 k_i}{16 C_{0,i} I_0^2 L^3 \omega_i^2}[k_{p1} k_{p2} k_s (k_s - k_{p1} - k_{p2}) A_{p1}(0) A_{p2}(0)]$$

Solving the coupled amplitude equations by substituting equations 6a and 6b, gives equation 7a and 7b:

$$A_s = a_s e^{i\alpha_s x} \quad (6a)$$

$$A_i = a_i e^{i\alpha_i x} \quad (6b)$$

$$\frac{\partial a_s}{\partial x} - i\kappa_s a_i^* e^{i(\Delta k_L + \alpha_{p1} + \alpha_{p2} - \alpha_s - \alpha_i)x} = 0 \quad (7a)$$

$$\frac{\partial a_i}{\partial x} - i\kappa_i a_s^* e^{i(\Delta k_L + \alpha_{p1} + \alpha_{p2} - \alpha_s - \alpha_i)x} = 0 \quad (7b)$$

These equations are analogous to the coupled amplitude equations for an optical parametric amplifier, and have the following solutions:

$$a_s(x) = \left[a_s(0)\left(\cosh gx - \frac{i\Delta k}{2g}\sinh gx\right) + \frac{\kappa_s}{g} a_i^*(0) \sinh gx\right] e^{i\Delta kx/2} \quad (8a)$$

$$a_i(x) = \left[a_i(0)\left(\cosh gx - \frac{i\Delta k}{2g}\sinh gx\right) + \frac{\kappa_i}{g} a_s^*(0) \sinh gx\right] e^{i\Delta kx/2} \quad (8b)$$

Where:

$$g = \sqrt{\kappa_s \kappa_i^* - \frac{\Delta k^2}{4}},$$

$$\Delta k = \Delta k_L + \alpha_{p1} + \alpha_{p2} - \alpha_s - \alpha_i = k_{p1} + k_{p2} - k_s - k_i + \alpha_{p1} + \alpha_{p2} - \alpha_s - \alpha_i$$

The equation for the gain, g, shows that the maximum gain for the input signal 5 ($a_s(x)$) is where the total phase difference ($\Delta k$) is low or zero, and allows the gain profile of the amplifier 1b to be calculated. The total phase difference is the phase difference incorporating both pump signals 7a,b, the input signal 5 and the idler signal 9.

The lower the phase difference can be maintained, the higher the gain. The resonators 31, 33 act to provide an additional phase difference (positive or negative) to the pump signals 7, to correct any phase difference between the input signal 5, the pump signals 7a,b, and the idler signal 9, so the total phase difference is kept at zero or nearly zero. The phase difference never increases above a threshold, such that the effect of any phase difference is negligible on the gain, within the operating bandwidth.

As can be seen from FIG. 5A, for the dual pump JJTWPA 1b described above, there is a sharp drop in the gain at the resonant frequencies and the pump frequencies. However, between the resonant frequencies, the gain quickly increases to a plateau 45, where it remains stable. This provides the amplifier 1b with a wide operating bandwidth, within the bandwidths defined by the resonant frequencies.

FIG. 5B shows the variation in the gain profile as the amplitude of the pump signals 7a, 7b is varied. The variation means that the gain profile can be controlled, for use in different applications. The highest curve 45a, shows the gain for pumps having I=0.100I*, the next curve 45b, shows the gain for pumps having I=0.095I*. The middle curve 45c is the curve shown in FIG. 5A (I=0.090I*). The next curve 45d is the gain for pumps having I=0.085I*, and the lowest curve 45e is the gain for pumps having I=0.080I*.

As can be seen, in this case, setting I=0.090 I* provides the most constant gain profile over the bandwidth. However, varying the current of the pumps allows the gain of the amplifier 1*b* to be controlled.

FIG. 5C shows the gain for different resonator 31, 33 frequencies. The lower curve 45*g* is the gain for an amplifier with resonator 31, 33 frequencies of approximately 4 GHz and 8 GHz, and pump currents I=0.090 I* (as shown in FIG. 4A). The higher curve 45*f* is the gain that can be achieved with resonator 31, 33 frequencies of approximately 3 GHz and 9 GHz, and pump currents I=0.114 I*.

As can be seen, by simply controlling the resonator and pump frequencies, the operational bandwidth of the amplifier 1*b* can be controlled. For different bandwidths, the pump current to achieve constant gain over the bandwidth varies due to the different characteristics of the circuit.

In another example, the resonators 31, 33 may have the same resonant frequency, such that only a single stopband is created in the dispersion relationship. In this case, a first pump signal 7*a* is operated at a frequency near the stopband, as discussed above. The second pump signal 7*b* is operated at a different frequency.

As shown by the above equations, the additional phase difference provided by operating the pump signal 7*a*, 7*b* close to the stopband increases as the frequency of the pump signal approaches the frequency of the stopband. Therefore, where there is only a single stopband, the frequency of one of the pump signals 7*a* or 7*b* must be adjusted to the resonant frequency of the stopband than in the case with two stopbands, to ensure the phase matching condition is achieved.

In this case, the gain of the operating bandwidth is gain limited by two regions with no gain. At one end of the operating bandwidth, there is a region of no gain formed by two separate parts—a first part where the frequency of the input signal 5 approaches the first pump signal 7*a*, and a second part where the frequency of the input signal 5 approaches the frequency of the stopband. However, at the other end of the operating bandwidth, the region of no gain is only formed by a single part where the frequency of the input signal 5 approaches the frequency of the second pump signal 7*b*.

Similar gain profiles to those shown in FIGS. 5A to 5C, can be obtained with a single stopband at 8 GHz, with the first pump 7*a* set at 7.9 GHz and second pump 7*b* set at 4.0 GHz.

With a single stopband or two stopbands, the pump frequencies define the operating bandwidth. In the example with a single stopband, one end of the operating bandwidth is defined by both the pump frequency and stopband. In the example with two stopbands, both ends of the width are defined by the pump frequency and stopband.

The width of the stopband defined by a resonator is, at least in part, dependent on the Q-factor of the resonator. A high Q-factor provides a narrow stopband, where waves cannot propagate down the transmission line 3. However, at very high Q, the gain profile is more sensitive to change in the frequency or amplitude of the pump signals 7*a,b*.

As discussed above, if the idler signal 9 is taken as an output, the transmission line 3 can be used as a frequency converter. The use of a non-linear medium 3*a* in a signal converter means that the amplitude of the idler signal 9 increases with the length of the medium 3*a*, therefore providing improved amplitude in the idler 9.

Whilst the input signal 5 may be in the range of microwave up to terahertz, electronic circuitry typically only operates for DC signals, or signals up to 20 GHz. In some situations circuitry can operate at higher frequency, but this will still not reach hundreds of GHz. Therefore, it can be useful to generate idler signals 9 at low frequencies, up to 20 GHz. Furthermore, it is often necessary to generate an idler signal 9 at fixed frequency, even where the input signal 5 varies in frequency. This allows the same electronics circuitry to be used when the input signal 5 varies in frequency.

As discussed in relation to FIG. 1B, in a three-wave mixing system, the frequency of the idler signal is the difference between twice the frequency of the pump signal 7, and the input signal 5. In order to obtain an idler signal 9 within the useful operating range for electronics, an input signal 5 close to twice the frequency of the pump signal 7, and hence outside the RF band, is required. Furthermore, if the pump frequency is fixed, for example because it has to be near the resonant frequency of a resonator, the frequency of the idler signal 9 will vary with the frequency of the input signal 5.

As discussed above in relation to FIG. 2B, in a four wave mixing process, the frequency of the idler signal 9 is the difference between the sum of the pump frequencies and the input signal 5. In examples with two stopbands, the pump frequencies are fixed near the frequencies of the stop bands. Therefore, the idler signal 9 is not fixed, and varies with the input signal 5.

However, in examples with a single stopband in the dispersion relationship, only the first pump frequency 7*a* is fixed. Therefore, in order to maintain a constant idler frequency 9, the second pump signal 7*b* can be varied depending on the frequency of the input signal 5. Therefore, an idler signal 9 with fixed frequency can be obtained for input signals over the operating bandwidth of the transmission line 3. The transmission line 3 is therefore a broadband frequency down converter. The person skilled in the art will appreciate that the same principle may be applied to an up-converter, to increase the frequency of an input signal.

As the frequency of the second pump signal 7*b* is varied to maintain constant frequency for the idler signal 9, the phase relationship of the signals passing through the transmission line 3 can be altered. The phase of the first pump signal 7*a* near the resonator frequency is highly non-linear as a function of the pump frequency. Therefore, the frequency of the first pump signal 7*a*, which is fixed near the resonator 31 can be fine-tuned to provide improved bandwidth.

The amplitude of the idler signal 9 increases as it passes along the transmission line 3. The amplitude of the idler signal 9 can be calculated using the above equations (see equation 8(b)). However, it should be noted that the initial amplitude of the idler signal 9 is $a_i(0)=0$. Therefore, the optimum gain is, at least in part, dependent on $\kappa_i/g$.

FIG. 11A shows the gain of the idler signal 9, relative to the initial amplitude of the input signal 5, for a range of frequencies of the input signal 5, with a resonator 31 at 100 GHz. A first curve 200*a*, having the peak at the lowest input signal frequency, shows the gain for a first pump 7*a* at 99.913 GHz, and a second pump 7*b* at 10 GHz. A second curve 200*b*, having the peak at the second lowest input signal frequency, shows the gain for a first pump at 99.980 GHz and a second pump 7*b* at 20 GHz. A third curve 200*c*, having the peak at the third lowest input signal frequency, shows the gain for a first pump at 100.25 GHz and a second pump 7*b* at 40 GHz. A fourth curve 200*d*, having the peak at the second highest input signal frequency, shows the gain for a first pump at 101.20 GHz and a second pump 7*b* at 60 GHz. A fifth curve 200*e*, having the peak at the highest input signal frequency, shows the gain for a first pump at 104.5 GHz and a second pump 7b at 80 GHz.

Each of the curves 200a-e follows a similar pattern, with a peak in the gain when the input signal frequency is equal to the sum of the frequencies of the pump signals 7a,b. As the input signal 5 reduces in frequency, the gain sharply drops off to zero at a minimum frequency. This forms a lower side band. As the input signal 5 increases in frequency, the gain reduces gradually to zero at a maximum frequency. This forms an upper side band.

For the first curve 200a, the minimum frequency is approximately 100 GHz and the maximum frequency is approximately 165 GHz. For the second curve 200b, the minimum frequency is approximately 102 GHz and the maximum frequency is approximately 170 GHz. For the third curve 200c, the minimum frequency is approximately 125 GHz and the maximum frequency is approximately 188 GHz. For the fourth curve 200d, the minimum frequency is approximately 158 GHz and the maximum frequency is approximately 210 GHz. For the first curve 200e, the minimum frequency is approximately 182 GHz and the maximum frequency is approximately 215 GHz.

In the example shown, the minimum and maximum frequencies determine the bandwidth of the idler signal 9 that can be achieved for each combination of pump frequencies. It will be appreciated that the frequency of the idler signal 9 is actually the modulus of the difference between the sum of the pump signals 7a,b and the input signal. Therefore at least some of the range of idler signal frequencies can be generated by both the lower and upper sideband, increasing the bandwidth of input signals that can be used.

FIG. 11B shows the gain for the idler signal 9 as a function of the frequency of the idler signal 9. The solid curves 202a-e shows the gain when the input signal 5 has frequency in the upper sideband of the pump combinations discussed in relation to FIG. 11A.

The highest curve 202a, shows the gain for a first pump 7a at 99.913 GHz, and a second pump 7b at 10 GHz. The second highest curve 202b shows the gain for a first pump at 99.980 GHz and a second pump 7b at 20 GHz. The third highest curve 202c shows the gain for a first pump at 100.25 GHz and a second pump 7b at 40 GHz. The second lowest curve 202d shows the gain for a first pump at 101.20 GHz and a second pump 7b at 60 GHz. The lowest curve 200e shows the gain for a first pump at 104.5 GHz and a second pump 7b at 80 GHz.

The broken line shows the gain 204 of the idler signal 9 when the input signal 5 has frequency in the lower sideband when the first pump 7a is at 99.913 GHz, and the second pump 7b is at 10 GHz.

In all cases, the gain of the idler signal 9 approaches a maximum at the minimum frequency of the idler signal 9. As the idler signal 9 increases in frequency the gain quickly decrease, with the rate of decreases tailing off.

As can be seen from FIGS. 11A and 11B, when the resonator 31 has a resonant frequency of 100 GHz, the different combinations of pump signals 7a,b provide gain of over 10 dB for input signals between 100 GHz and 198 GHz, with idler signals 9 up to 20 GHz in frequency.

Therefore, idler signals 9 in the useful range for electronics can be generated with a gain of over 10 dB, over a wide range of input signals. For some combination of pump signal 7a,b frequencies, even higher frequency idler signals 9 can be generate and/or even higher gain can be achieved. For example, with the first pump 7a at 99.913 GHz, and a second pump 7b at 10 GHz, the gain of the idler signal 9 is above 10 dB up to approximately 35 GHz idler frequency. With this combination of pump signal 7a,b frequencies, the gain is over 20 dB for a range of input signals 5.

It will be appreciated that in FIG. 11A, a portion of the lower sideband has been omitted for clarity on the curves with second pump signal 7b of frequency above 10 GHz. Similarly, FIG. 11B only shows the gain for a lower sideband 204 where the second pump frequency is 10 GHz.

FIG. 11C shows, by way of example, the full lower sideband when the pump signal is 80 GHz. As can be seen, after the minimum frequency. There is a broadband region of gain 218 in the lower sideband. At the minimum frequency, the gain reduces, and turns negative (so there is signal attenuation). As the input signal frequency further reduces, a stable, broadband gain is achieved.

FIG. 11C also shows the gain 204e as a function of the frequency of the idler signal 9. This is also broadband, with stable gain over 10 dB from 10 GHz to 80 GHz.

FIG. 12A shows the gain of the idler signal 9 as a function of the frequency of input signal 5, when the resonant frequency of the resonator 31 is at 500 GHz. FIG. 12B shows the gain of the idler signal 9 as a function of the idler signal frequency for both the lower sideband and upper sideband.

In FIG. 12A, a first curve 206a, shows the gain with a first pump 7a at 499.8395 GHz, and a second pump at 20 GHz. FIG. 12B shows the gain for this combination of pump signals 7a,b for the upper sideband 208a and the lower sideband 210a.

A second curve 206b in FIG. 12A, shows the gain with a first pump 7a at 499.94 GHz, and a second pump at 60 GHz. FIG. 12B shows the gain for this combination of pumps for the upper sideband 208b and the lower sideband 210b. A third curve 206c in FIG. 12A, shows the gain with a first pump 7a at 500.15 GHz, and a second pump at 100 GHz. FIG. 12B shows the gain for this combination of pumps for the upper sideband 208c and the lower sideband 210c.

The example illustrated in FIGS. 12A to 12B show that idler signals up to 17 GHz can be obtained with gain of over 20 dB, for input signals from 500 GHz to 620 GHz.

In the example shown in FIGS. 11A and 11B, five separate pump combinations are required to cover the range of 100 GHz to approximately 200 GHz. However, only three pump combinations are required to cover 500 GHz to 620 GHz. This is simply because the percentage bandwidth of the devices is relatively unchanged, hence 20 GHz at 100 GHz can become 100 GHz at 500 GHz.

In one example, as discussed above, a down converter is useful to generate idler signals 9 at fixed frequency band, independent of the frequency of input signal 5. For example, if an idler signal at 8 GHz is required, then the resonator 31 can be chosen based on the expected range of the input signal, and the pumps 7a,b can be varied to provide the highest possible gain, based on the curves shown in FIGS. 11A and 12A, and the frequency of the input signal 5.

It will be appreciated that the above combinations of resonator frequencies and pump signal frequencies are given by way of example only. Any combination of pump signals 7a,b can be used. Where there is only a single fixed resonator 31, the frequency of the second pump signal 7b that is required to provide an idler signal 9 in the desired operation bandwidth increases as the frequency of the input signal 5 increase. The range of the input signals that can be obtained with useful gain (e.g. above 10 dB) is limited by the second pump signal 7b. Therefore the bandwidth is limited by the operational bandwidth of the source that provides the second pump 7b—in other words, the operational bandwidth is limited by the range of signals that can be generated by the source of the second pump signal 7b.

For example, with reference to FIG. 12A, in order to cover an operational bandwidth from 500 GHz to above 620 GHz, the source of the second pump signal 7b needs to be able to provide power from kHz up to 140 GHz.

As discussed above, the frequency of the first pump signal 7a is fine-tuned as the second pump signal 7b changes in frequency. In general, as the second pump signal 7b moves further away from the resonant frequency of the resonator 31, the effect of fine-tuning the first pump signal 7a is reduced. As the effect of the fine-tuning is reduced, the bandwidth of the gain becomes narrower. Therefore, with an extremely wideband source for the second pump signal 7b, a limit may be imposed on the operational bandwidth as the gain becomes narrower. However, in practice, the limit of the second pump signal 7b is reached first.

The limitation of the bandwidth caused by the source for the second pump signal 7b can be addressed by reintroducing stopbands at different frequencies. The first pump signal 7a is set at one of the stopbands. Therefore, the first pump signal can be seen as selecting a different operating band. In this example, the frequency of the second pump signal is largely fixed 7b. It is possible to vary the frequency of the second pump signal 7b. However, moving the second pump signal 7b provides a gain profile similar to the gain profiles discussed in FIG. 12A. Therefore, significant changes in the second pump signal 7b are redundant in light of the available operating bands. In the examples discussed in relation to FIGS. 11 and 12, the first pump frequency 7a is fine tuned and fixed near the frequency of the resonator 31, and the second pump signal 7b varied. In this example, the first pump frequency 7a is varied, and the second pump signal is relatively fixed.

FIG. 13A shows the gain profile for a transmission line 3 with resonators 31, 33 at 500 GHz, 540 GHz and 580 GHz, as a function of the frequency of the input signal 5. A first curve 212a, shows the gain with a first pump 7a at 499.7585 GHz, and a second pump at 20 GHz. A second curve 212b shows the gain with a first pump 7a at 540.0963 GHz, and a second pump at 20 GHz. A third curve 212c shows the gain with a first pump 7a at 580.1781 GHz, and a second pump at 20 GHz.

FIG. 13B shows the gain as a function of the idler signal frequency, for the upper and lower sidebands. For clarity, the individual plots are not labelled, as it can be seen that they all follow a similar pattern.

Using the upper and lower sidebands, the whole RF input bandwidth of 500 GHz to 600 GHz can be covered, with symmetrical gain profile around the peak (so the bands are symmetrical) as a function of input signal frequency, and near identical gain profiles as a function of idler signal frequency. Gain levels of over 25 dB can be obtained for idler signals up to 16 GHz. However, there are small regions, at the resonators 31, 33, where there is zero gain.

With multiple resonators 31, 33, the gain profile for the idler signal 9 can be controlled by fine tuning of the first pump signal 7a. FIG. 13C shows the gain profiles calculated with resonators at 500 GHz, 540 GHz and 580 GHz, as a function of the input signal frequency. A first curve 214a, shows the gain with a first pump 7a at 499.757 GHz, and a second pump at 20 GHz. A second curve 214b shows the gain with a first pump 7a at 540.095 GHz, and a second pump at 20 GHz. A third curve 214c shows the gain with a first pump 7a at 580.177 GHz, and a second pump at 20 GHz.

FIG. 13D shows the gain as a function of the frequency of the idler signal 9, for the pump combinations discussed in relation to FIG. 13C. A first curve 220a shows the gain with a first pump 7a at 499.757 GHz, and a second pump at 20 GHz, for the upper sideband, and a second curve 220e shows the gain for the lower sideband. A third curve 220c shows the gain with a first pump 7a at 540.095 GHz, and a second pump at 20 GHz, for the upper sideband, and a fourth curve 220b shows the gain for the lower sideband. A fifth curve 220d shows the gain with a first pump 7a at 580.177 GHz, and a second pump at 20 GHz, for the upper sideband.

Comparison to FIGS. 13A and 13B shows that, although the overall gain has dropped, the gain profile is flatter. This can provide a flatter gain profile as a function of idler frequency. Similar results can be achieved by tuning the first pump 7a with a single resonator 31, however, in this case the sideband profiles are not symmetric, and so the gain profiles from the different sidebands will be different.

Comparison of FIGS. 13A and 13C shows that the gain is very sensitive to the fine tuning of the first pump signal 7a. When the first pump 7a is not fine-tuned, the bandwidth of the gain for the idler signal can be relatively narrow. FIG. 14A shows an example, where the gain when the first pump 7a is fixed at 99.85 GHz, with the resonator 31 at 100 GHz, and the second pump 7b swept from 1 to 50 GHz. FIG. 14A shows the gain profile for the second pump at 1 GHz, 4 GHz, 8 GHz, 12 GHz, 16 GHz, 20 GHz, 30 GHz, 40 GHz and 50 GHz. In principle, the second pump signal can be swept from DC signal up to tens of GHz. The input signal frequency at which gain occurs increases with the second pump signal. FIG. 14B shows the gain of FIG. 14A, as a function of the frequency of the idler signal 9. The lowest curve represents the lowest second pump frequency, and the subsequent curves represent the sweep in pump frequencies.

In example method of operation, the first pump signal 7a can be fixed, and the second pump signal 7b swept. By monitoring a fixed idler signal frequency, an input signal can be detected. Consider, for example, an input signal 5 at 140 GHz, and monitoring an idler signal 9 around 0.1 GHz.

The second curve from the right 216a in FIG. 14A, and the second highest curve 216b in FIG. 14B show the gain when the second pump 7b is at 40 GHz. When the pump is below this, there will be little or no gain for the signal at 140 GHz. However, as the pump approaches, there will be gain that can be detected.

In any of the above examples, the two pump signals 7a,b may mix in the transmission lines 3 resulting in a further signal being generated at the sum and/or difference of the pump signals 7a,b. If the relative bandwidth (the bandwidth divided by the central frequency) is greater than 100%, a signal may be generated within the bandwidth. In some applications this can be tolerated. However, in other applications, the pump frequencies are chosen to keep the relative bandwidth at 100%.

It will be appreciated that the model, parameters and structure discussed above is given by way of example only. The first resonator 31 and second resonator 33 may be coupled to the Josephson junction in any suitable way. For example, both resonators 31, 33 may be coupled at the same point/node in the circuit.

The Josephson junction may be formed of electrodes of any suitable superconducting materials, separated by a region of any suitable non-superconducting material. For example, the superconducting material may be niobium, niobium nitride, niobium titanium nitride, or any other low or high temperature superconductor. The superconducting material may also be aluminium, or another metal, in a superconducting state. The insulating layer may be an aluminium oxide or nitride, or any other insulating material.

In other examples, any layered structure that allows quantum tunneling across a central layer, and which has sufficiency non-linearity, may be used. For example a superconductor-metal-superconductor or superconductor-insulator-metal structure may be used.

Furthermore, in the above example, there are three Josephson junctions 23, 27 between each resonator 31, 33. This increases the non-linearity of the transmission line 3, and provides physical space for the resonators 31, 33. However, any number of Josephson junctions 23, 27 may be provided between each resonator 31, 33. For example, there may be only one Josephson junction 23, 27, or two, or more than three. Furthermore, the number of Josephson junctions 23, 27 between resonators 31, 33 may vary.

In addition, the resonator 31, 33 described above is by way of example only. Any suitable resonator could be used, and in some examples, the resonator is not necessarily coupled to earth.

It will also be appreciated that the electrical characteristics of the Josephson junctions (such as the intrinsic capacitance 25a,b,c, 29a,b,c, the capacitance of the junction, and the inductance of the junction) are a result of the composition and structure of the junction. It will be apparent that a range of junctions 25a,b,c, 29a,b,c may be implemented, with a range of different electrical characteristics.

FIGS. 9A to 9C illustrates an example structure for implementing the JJTWPA 1b discussed in relation to FIGS. 4A to 5C. The structure 100 is formed on a chip or die and includes the transmission line 3 extending between a pair of bonding contacts 102a,b. The bonding contacts 102a,b provide a means for connecting the transmission line 3 to a wider system (not shown) using wire bonding or other suitable techniques. Resonators 31, 33 are formed on either side of the transmission line 3.

The chip 100 is formed of a conducting layer 104 provided on a substrate 106 as shown in FIGS. 9A and 9B. For example, the substrate 106 may be silicon and the conducting layer 104 aluminum.

The transmission line 3 is formed by electrically isolating a thin strip 108 of the conducting layer 104 in the plane of the substrate 106. This is accomplished by removing (for example by etching) the conducting layer 104 down to the substrate 106 on either side of the strip 108, to isolate the strip 108. The transmission line 3 follows a path of that minimises the overall space taken up on the chip 100, whilst providing the desired length.

FIGS. 9A and 9B do not show the Josephson junctions, for clarity. It will be appreciated that the Josephson junctions may be provided in any suitable manner. For example, they may be provided in the structure of the conducting layer 104, or formed in the conducting layer using known processing techniques.

FIG. 9B shows a section of the transmission line 3 and a single resonator 31, 33 in more detail. The capacitor 37 and inductor 39 in the resonator 31, 33 are also formed by isolating regions of the conducting layer 104.

Each plate of the capacitor 37 is formed by a track 110a, b, with a plurality of fingers 112a,b extending perpendicular to the track 110a, b. The tracks 110a, b extend parallel to each other, with the fingers 112a, b extending towards the other track 110a, b without joining it, so that the fingers 112a, b are interleaved.

The capacitance of the capacitor 37 can be tuned by varying the width and spacing of the tracks 110a, b and the width, spacing and number of the fingers 112a, b.

The inductor 39 is formed by a conductance path 114 joining the tracks 110a, b of the capacitor plates. The conductance path 114 joins the tracks 110a, b at a first end of each track 110a, b. The inductance of the inductor 39 can be tuned by varying the width and length of the path 114. In the example shown in FIG. 9B, the conductance path 114 doubles back on itself a number of times, parallel to the fingers 112a, b of the capacitor, to create the correct length path 114 without using too much space on the chip 100. A coupling region 114a of the conductance path 114 extends parallel to the tracks of the capacitor 37.

The resonator 31, 33 is coupled to the transmission line 3 by providing the resonator adjacent the transmission line 3. The resonator 31, 33 is provided so that the tracks 110a, b of the capacitor plates extend parallel to the transmission line 3 in the region where the resonator 31, 33 is coupled to the transmission line 3. The resonator 31, 33 is positioned so that the coupling region 114a of the inductor 39 and the track 110a of a first plate of the capacitor 37 run adjacent the transmission line 3.

The resonator 31, 33 is spaced from the transmission line 3. However, the conducting layer 104 has been removed between the transmission line 3 and the resonator 31, 33, so that there is direct coupling between the resonator and transmission line 3. This maximises the coupling capacitance for the resonators, shown by capacitors 35a, b between the transmission line 3 and resonators 31, 33 in FIG. 4A.

In the example shown in FIG. 9A, the first resonators 31 are provided on a first side of the transmission line 3 and the second resonators 33 on the opposite side, with the first resonators 31 and second resonators 33 alternated along the length of the transmission line 3. However, it will be appreciated that this is by way of example only, and any arrangement of resonators 31, 33 can be used.

FIG. 9C illustrates the bonding contacts 102a, b in further detail. As shown in FIG. 9C, the bonding contacts 102a, b are formed by a conducting region 116 surrounded by a region of the exposed substrate 106, such that the conducting region 116 is electrically isolated.

The conducting region 116 is formed by a first rectangular section 116a and a second tapered section 116b. The first section 116a provides an area for connection out to the wider system.

The tapered section couples the transmission line 3 to the second section 116b. At a first end, the tapered section 116b is the same width as the rectangular section 116a. Over the length of the tapered section 116b, the width narrows to match the transmission line 3.

The shape of the tapered section 116b provides for impedance matching between the transmission line 3 and the rest of the system the bonding pads 102a, b connect out to. Typically, the transmission line may have an impedance of 20 Ohms or less. However, the wider system may have an impedance of 50 Ohms or more. Therefore, impedance mismatching can be significant.

If the width narrows simply as a linear function of the length of the tapered section 116b, the bonding pads 102a, b may act to reflect signals, such that the transmission line acts as a resonant cavity. However, as discussed above, this can limit the bandwidth of the transmission line 3, and result in losses and rapid variation in gain (for example around ±10 dB on a 10 dB gain profile).

Therefore, the edges 118 of the tapered section 116b follow a curved profile. The curved profile defines the width of the tapered section 116b as a function of the distance between the transmission line 3 and the rectangular section 116a, the material and dimensions of the substrate 106, conducting layer 104 and superconducting materials, and the required impedance at either end of the tapered section. The profile is calculated to minimise reflection of signals. The profile can be seen as a finline shaped taper feed.

Around the first section 116a, and the transmission line 3 the exposed substrate 106 also follows a rectangular profile. Around the tapered section 116b, the exposed substrate again follows a curved profile. However, the profile is different to the conducting region 116, since the exposed substrate 106 around the transmission line 3 is narrower than the exposed substrate 106 around the first section 116b of the conducting region 116 of the bonding contact 102.

As with the conducting region 116, the profile of the exposed substrate 106 is a function of the distance between the transmission line 3 and the first section 116a, the material and dimensions of the substrate 106, conducting layer 104 and superconducting materials, and the required impedance at either end of the tapered section.

Use of an impedance matching bonding contact 102 as described above reduces the risk of signals reflecting at the contact 102, reducing the formation of a resonant cavity, providing wider band use, and an improvement of 20 to 30 dB in performance. In the examples discussed above, the resonator 31, 33 is directly coupled to the transmission line 3. In other examples, there may be a region of conducting layer 104 provided between the resonator 31, 33 and the transmission line 3, and electrically isolated from the two.

In the example shown in FIG. 9B, the resonator 31, 33 is not coupled to earth (not including any leakage to the earth plane, shown by the conductive layer 104). It will be appreciated that, as discussed above, this is optional. Coupling to earth may be achieved be connecting the second track 110b to the body of the conducting layer 104.

The contact 102a, b discussed above is also given by way of example only. Any suitable contact that achieves sufficient impedance matching may also be used.

It will be appreciated that the structure 100 discussed above provides a structure that can be used to implement a JJTWPA 1b in a single layer process, since all features are formed in the same plane. The use of a single layer process means that the structure is simple to form, compared to multi-layer processes. The structure given above and shown in FIGS. 9A to 9C is given by way of example only, and any suitable structure can be used.

FIG. 6A shows the unit cell 21 for a dual pump KITWPA 1b. As discussed above, in this case, the transmission line 3 is formed by a long superconducting wire 47. Stopbands are created in the dispersion relationship by providing periodic loading on the wire 47. In the example shown in FIG. 6A, the wire is coplanar waveguide, however, it will be appreciated that a microstrip or any other type of transmission line could also be used.

The periodic loading is provided by altering the structure of the wire 47 at spaced intervals. In this case, the structural alteration is to provide regions 49a, 49b, 49c where the impedance of the wire 47 is altered, by increasing the width of the wire 47. The spacing of the wider regions 49a,b,c is approximately $0.5\lambda_{per}$, where $f_{per}=c/\lambda_{per}$ determines the fundamental frequency of the stopbands (c is the speed of light). The stopbands are generated by the sudden change in the characteristic impedance.

FIGS. 6B and 6C shows examples of the dispersion relationship for a wire 47 with periodic loading. FIG. 6B shows the dispersion on the same scale as FIGS. 4B and 4C. FIG. 6C shows the change in dispersion (the difference between the dispersion in the presence of the dispersion control elements, and the dispersion in the absence of the dispersion control elements), to show the features of the dispersion relationship more clearly.

As can be seen, periodic loading generates a first stopband at $f_{per}$, with subsequent stopbands generated at integer multiples of $f_{per}$. Between the stopbands, the dispersion relationship of the wire 47 is approximately linear. The dispersion relationship between the stopbands is the intrinsic dispersion relationship of the wire 47. The intrinsic dispersion relationship is modified by the stopbands, and the dispersion relationship without the effect of the stopbands can be seen by interpolation of the dispersion relationship at frequencies between the stopbands, so that it extends across the stopbands.

It is known that the KITWPA can generate the third harmonic of the pump signals 7a, 7b. There is no generation of a second harmonic. The generation of the third harmonic can lead to generation of a shockwave in the transmission line 3, which eliminates gain. The third and higher harmonics that lead to the shockwave are in the JJTWPA, however, in this instance, the Josephson junctions 23, 27 act as low pass filters to prevent these higher harmonics forming, hence blocking the shockwave.

To overcome this, $f_{per}$ is set at three times a first of the pump frequencies. Furthermore, one in every three of the wider regions 49a,b,c is slightly altered. This means that as well as integer multiples of $f_{per}$, stopbands are provided at multiples of $\frac{1}{3} f_{per}$ (for example, $\frac{1}{3} f_{per}$, $\frac{2}{3} f_{per}$, $\frac{4}{3} f_{per}$ and the like). The first wide region 49a, and second wide region 49b are both of first length, whilst the third wide region 49c is shorter, such that the third stopband is wider than the first or second.

With a first pump frequency set near the stopband at $\frac{1}{3}f_{per}$, the third harmonic will fall within the wider stopband, preventing propagation of the third harmonic down the line. However, the pump frequency still does not fall within a stopband.

The same effect can be achieved by setting the pump frequency at $f_{per}$, since the third harmonic will still fall within the wider stopband.

As with the JJTWPA, for optimum gain, the pump frequencies should be close to the frequencies of two stopbands. By making the third stopband wider, it is ensured that the third harmonic falls within a stopband. This stops generation of shockwaves. Shortening every third wide region 49c also generates stopbands.

In the example shown in FIG. 6B $f_{per}$=12 GHz. As can be seen, stopbands appear at approximately 4 GHz ($\frac{1}{3} f_{per}$) and 8 GHz ($\frac{2}{3} f_{per}$).

FIG. 7 shows the gain for a KITWPA 1b having 224 repeating unit cells 21, with pump currents of 0.113 I*, at 3.98 GHz, and 7.95 GHz. The modelled dual pump KITWPA 1b has 224 unit cells 21 as shown in FIG. 6A. The impedance of the narrow sections is approximately 300Ω, and the impedance of the wide sections is 150Ω.

As can be seen, there is once again relatively constant gain between the stopbands of the dispersion relationship, compared to the single pump TWPA 1a. In this example, the gain at the stopbands is again zero, although this cannot be seen from the plot due to the resolution of the scale.

The dual pump KITWPA 1b can be modelled on a similar basis to the dual pump JJTWPA 1b. The non-linear wave equation for the KITWPA 1b can be described as:

$$\frac{\partial^2 I}{\partial z^2} - \frac{\partial}{\partial t}\left[L(I)C\frac{\partial}{\partial t}\right] = 0 \quad (9)$$

Where:

$$L(I) = L_0\left(1 + \frac{I^2}{I_*^2}\right)$$

The same assumptions regarding the first and second derivatives are made as with the JJTWPA 1b, and the solutions are assumed to be forward propagating waves of the form:

$$I = \frac{1}{2}\Big[A_{p1}(z)e^{i(k_{p1}z+\omega_{p1}t)} + A_{p2}(z)e^{i(k_{p2}z+\omega_{p2}t)} + \quad (10)$$
$$A_s(z)e^{i(k_s z+\omega_s t)} + A_i(z)e^{i(k_i z+\omega_i t)} + c.c\Big]$$

Substituting equations 10 into equation 9 gives:

$$\frac{\partial A_{p1}(z)}{\partial z} - \frac{iL_0 C}{8I_*^2 k_{p1}}\omega_{p1}^2 A_{p1}(z)[A_{p1}(z)A_{p1}^*(z) + 2A_{p2}(z)A_{p2}^*(z)] = 0 \quad (11a)$$

$$\frac{\partial A_{p2}(z)}{\partial z} - \frac{iL_0 C}{8I_*^2 k_{p2}}\omega_{p2}^2 A_{p2}(z)[A_{p2}(z)A_{p2}^*(z) + 2A_{p1}(z)A_{p1}^*(z)] = 0 \quad (11b)$$

$$\frac{\partial A_s(z)}{\partial z} - i\frac{L_0 C}{4k_s I_*^2}\omega_s^2[A_{p1}A_{p1}^*A_s + A_{p2}A_{p2}^*A_s + A_{p1}A_{p2}A_i^* e^{i\Delta k z}] = 0 \quad (11b)$$

$$\frac{\partial A_i(z)}{\partial z} - i\frac{L_0 C}{4k_i I_*^2}\omega_i^2[A_{p1}A_{p1}^*A_i + A_{p2}A_{p2}^*A_i + A_{p1}A_{p2}A_s^* e^{i\Delta k z}] = 0 \quad (11d)$$

Assuming no losses, the propagation equation for the pump fields can be solved as:

$$A_{p1}(z) = A_{p1}(0)e^{i(\alpha_{p1})z}$$

$$A_{p2}(Z) = A_{p2}(0)e^{i(\alpha_{p2})z}$$

Where the coupling coefficients are defined as:

$$\alpha_{p1} = k_{p1}(\alpha_{pA} + 2\alpha_{pB}), \ \alpha_{pA} = \frac{1}{8I_*^2}A_{p1}(0)A_{p1}^*(0)$$

$$\alpha_{p2} = k_{p2}(\alpha_{pB} + 2\alpha_{pA}), \ \alpha_{pB} = \frac{1}{8I_*^2}A_{p2}(0)A_{p2}^*(0)$$

Substituting the pump fields into equation 11 for the signal and idler fields gives:

$$\frac{\partial A_s}{\partial z} - i\alpha_s A_s - i\kappa_s A_i^* e^{i(\Delta k + \alpha_{p1} + \alpha_{p2})z} = 0$$

$$\frac{\partial A_i}{\partial z} - i\alpha_i A_i - i\kappa_i A_s^* e^{i(\Delta k + \alpha_{p1} + \alpha_{p2})z} = 0$$

Where the coupling coefficients are defined as:

$$\alpha_s = 2k_s(\alpha_{pA} + \alpha_{pB}), \ \kappa_s = \frac{k_s}{4I_*^2}[A_{p1}(0)A_{p2}(0)]$$

$$\alpha_i = 2k_i(\alpha_{pA} + \alpha_{pB}), \ \kappa_i = \frac{k_i}{4I_*^2}[A_{p1}(0)A_{p2}(0)]$$

Solving the coupled amplitude equations by substituting equations 12a and 12b, gives equation 13a and 13b:

$$A_s = a_s e^{i\alpha_s z} \quad (12a)$$

$$A_i = a_i e^{i\alpha_i z} \quad (12b)$$

$$\frac{\partial a_s}{\partial z} - i\kappa_s a_i^* e^{i(\Delta k + \alpha_{p1} + \alpha_{p2} - \alpha_s - \alpha_i)z} = 0 \quad (13a)$$

$$\frac{\partial a_i}{\partial z} - i\kappa_i a_s^* e^{i(\Delta k + \alpha_{p1} + \alpha_{p2} - \alpha_s - \alpha_i)z} = 0 \quad (13b)$$

These equations are analogous to equations 7a and 7b, and have the solutions:

$$a_s(z) = \left[a_s(0)\left(\cosh gz - \frac{i\epsilon_k}{2g}\sinh gz\right) + \frac{\kappa_s}{g}a_i^*(0)\sinh gz\right]e^{i\epsilon_k z/2} \quad (14a)$$

$$a_i(z) = \left[a_i(0)\left(\cosh gz - \frac{i\epsilon_k}{2g}\sinh gz\right) + \frac{\kappa_i}{g}a_s^*(0)\sinh gz\right]e^{i\epsilon_k z/2} \quad (14b)$$

Where:

$$g = \sqrt{\kappa_s \kappa_i^* - \frac{\epsilon k^2}{4}},$$

$$\epsilon_k = \Delta k + \alpha_{p1} + \alpha_{p2} - \alpha_s - \alpha_s =$$
$$k_{p1} + k_{p2} - k_s - k_i + +\alpha_{p1} + \alpha_{p2} - \alpha_s - \alpha_i$$

In a similar manner as discussed above in relation to the JJTWPA 1b, the pump current can be used to control the gain, and the relative bandwidth may or may not be controlled to be 100%.

As discussed above in relation to the JJTWPA 1b, in some examples, only one of the pump frequencies is operated near to a stopband. The second pump frequency can be operated at any frequency to define the operational bandwidth. As with the JJTWPA examples, the second edge of the operational bandwidth is defined only by the frequency of the input signal 5 approaching the frequency of the second pump signal 7b.

As also discussed in relation to the JJTWPA 1b the transmission line 3 can be used to generate a fixed idler signal 9 over a range of input signals 5, using the KITWPA 1b as a down converter.

Furthermore, as with the JJTWPA 1b example, the lower the phase difference can be maintained, the higher the gain. The periodic loading acts to correct any phase mismatch between the input signal 5, the idler signal 9 and the pump signals 7a,b, and so the phase difference is kept at zero or nearly zero. The periodic loading is such that the phase difference never increases above a threshold, such that the effect of any phase mismatch is negligible on the gain.

It will be appreciated that the pump signals 7a, b may mix in the KITWPA 1b, as discussed in relation to the JJTWPA 1b.

It will also be appreciated that the wire 47 may be formed of any suitable superconducting material. For example, the wire may be titanium nitride or niobium titanium nitride, vanadium nitride, or any other high normal state resistivity superconductor.

Also, the periodic loading may be achieved by any suitable change in the wire 47 that creates stopbands. For example, the material or thickness of the wire 47 may be changed, rather than the width.

It will be appreciated that, when formed using a coplanar waveguide, the KITWPA 1b can be formed in a single layer process, since it simply requires use of a co-planar wire 47.

FIGS. 15A to D illustrate an example of a structure 300 for providing a KITWPA 1b, using a coplanar waveguide. The structure 300 is formed on a chip or die and includes the transmission line 3 extending between a pair of bonding contacts 102a,b. The chip has a conducting layer 104 and a substrate 106, as in the example discussed in relation to FIGS. 9A to 9C.

As also discussed in relation to FIGS. 9A and 9C, the transmission line 3 is formed by electrically isolating a thin strip 302 of the conducting layer 104 in the plane of the substrate 106. As discussed above, the periodic loading is created by forming regions 49a,b, where the thin strip 302 is widened. As shown in FIG. 15A, the transmission line 3 is arranged in a spiral, in order to maximise the length of the transmission line 3 available on a given chip size.

FIGS. 15C and 15D show the transmission line 3 and periodic loading in more detail. A spacing of 320 microns is provided between adjacent spirals of the transmission line 3. FIG. 3B shows a bonding contact 102a in further detail. In this example, the bonding contacts 102a, b is as discussed in relation to FIG. 9C.

It will be appreciated that the example shown in FIGS. 15A to D is given by way of example only. Any suitable structure may be used. Furthermore, the use of the bonding contacts 102a,b is by way of example only, and any suitable bonding contact may be used.

In a third example, a dual pump TWPA 1b may include a transmission line 3 formed by a superconducting wire 47 as discussed in relation to FIG. 6A, and resonators 31, 33 as described in relation to FIG. 4A coupled to the wire 47. In this case, a plurality of first resonators 31 are provided to create a stopband at a first frequency, and a plurality of second resonators 33 are provided to create a stopband at a second frequency. Any number and spacing of resonators 31, 33 may be used. An example gain profile 55 for this TWPA 1b is shown in FIG. 8.

Third resonators (not shown) could be provided at a third frequency, to prevent formation of shockwaves in the wire 47.

FIG. 10 shows an example of a region of a TWPA 1 formed in this way. As shown in FIG. 10, the superconducting wire 47 may include one or more first regions 202 in which the superconducting wire 47 is doubled back on itself to provide the desired length, whilst saving on overall space on the chip. Between these regions 202, the wire 47 is straight, with resonators 31, 33 formed as discussed in relation to FIG. 9B. As with the above examples, the bonding contacts 102a, b discussed in relation to FIG. 9C may be used, although this is optional, and any other type of bonding contact may be used.

This structure is given by way of example only, and any suitable structure can be used.

As with the JJTWPA 1b and KITWPA 1b, this transmission line 3 may be operated as a down converter.

It will be appreciated that in other examples, further pump signals 7 may be provided, all at different frequencies, tuned to further stopbands in the dispersion relationship. In examples where resonators 31, 33 are used to engineer the dispersion relationship, resonators 31, 33 may be provided with further resonant frequencies. In periodic loading examples, the further stopbands may exist already.

In the examples discussed above, where dual pump signals 7a, 7b are used, the dispersion relationship of the transmission line 3 is engineered to have stopbands at the edges of the operational bandwidth of the amplifier 1b (the bandwidth over which the amplifier provides a relatively constant level of gain). In examples with three or more pumps, the dispersion relationship will have stopbands at the edges of the bandwidth, and further stopbands within the operational bandwidth. These stopbands will have associated regions of low or no gain.

In the examples discussed above, the pump signals 7 have equal amplitude (the same current). However, it will be appreciated that further control over the gain may be exerted by varying the pump signals to have different amplitude.

The input signal 5 may be generated by any suitable source. For example, the input signal 5 may be received from an antenna, generated by a local oscillator, or be a detected signal that is to be amplified. Similarly, the pump signals 7 may be generated by any suitable oscillator, such as a microwave oscillator, or local oscillator such as a Schottky diode based oscillator, or multiplier chain.

In the above examples, the transmission line 3 is implemented using either an embedded array of Josephson junctions 23, 27, or a superconducting wire 47 (microstrip or coplanar waveguide). In a further example, the transmission line 3 may be a superconducting wire embedded with Josephson junctions. In yet a further example, the transmission line 3 may include superconducting quantum interference devices (SQUIDs) in place of individual Josephson Junctions. A SQUID is a pair of Josephson Junctions connected in parallel. It will be appreciated that these are just given by way of example only, and any suitable low loss, non-linear medium could be used. In some examples the non-linear medium has non-zero dispersion. In other examples, the medium may be dispersionless in the absence of dispersion control elements. In this case, the dispersion control elements still introduce stopbands, and may further introduce some level of dispersion, around the stopbands.

It will be appreciated that any other suitable phase matching techniques may be used, in place of resonators or periodic loading. Any suitable dispersion control element may be used to alter the dispersion relationship away from the intrinsic dispersion relationship that is approximately linear, in order to ensure that the total phase mismatch is close to zero. The resonators 31, 33 and periodic loading are just two examples of this.

Furthermore, in some examples, the phase matching may be achieved without a stopband. Instead, the dispersion relationship may simply diverge away from the intrinsic (approximately linear) relationship at the first frequency and the second frequency. The operational frequency of the transmission line 3 will fall within the range of first and second frequencies. However, since there is no stopband, waves still may be able to propagate at the first and second frequency, and so there may still be some level of gain at these frequencies.

In the above example, the transmission line 3 has a separate signal input 15 and pump inputs 17, 19. It will be appreciated that in some examples, the transmission line may contain a single pump input (not shown) and the pump signals 7a,b may be combined before the transmission line 3. In other examples, a single input (not shown) may be provided, and the pump signals 7a,b and input signal 5 may be combined before the transmission line 3.

In the models discussed above, a number of parameters are used. These parameters are by way of example only, and a wide range of different resonant frequencies and component values may be used.

In the examples discussed above, amplifiers have been shown operating between 3 GHz and 9 GHz or 4 GHz and 8 GHz. It will be appreciated that by choice of suitable superconducting material, components and structure, the above dual pump amplifiers 1b may provide amplification of signals between radio waves up to THz signals.

The superconducting materials remain superconducting (and hence low loss) when frequencies of signals propagating through the material are below a breakdown frequency. Typical breakdown frequencies for superconducting materials are hundreds of GHz or higher. This breakdown frequency controls the maximum frequency of input signal 5 that may be used. For example, for Niobium is approximately 680 GHz, and the breakdown frequency for Niobium nitride or Niobium titanium nitride is approximately 1.4 to 1.5 THz.

It will be appreciated that the four-wave mixing transmission 3 discussed above may be operated at cryogenic temperatures, or higher, and can even be operated at room temperature, when using room temperature superconducting materials.

The invention claimed is:

1. A four-wave mixing radio frequency transmission line including:
   an input arranged to receive:
      a first pump signal having a first pump frequency;
      a second pump signal, having a second pump frequency, different from the first pump frequency; and
      an input signal to be amplified;
   a non-linear medium having an intrinsic dispersion relationship, the medium arranged to allow interaction between the input signal, the first pump signal and the second pump signal, such that the input signal is amplified and an idler signal is generated and amplified; and
   a plurality of dispersion control elements, the dispersion control elements arranged to alter the dispersion relationship of the medium to diverge from the intrinsic dispersion relationship at a first frequency, and at a second frequency wherein the first pump frequency is near the first frequency and the second pump frequency is near the second frequency, such that the total phase difference between the input signal, the first pump signal, the second pump signal and the idler signal is kept at zero or substantially zero as the first pump signal, the second pump signal, the input signal and the idler signal propagate down the transmission line.

2. The four-wave mixing radio frequency transmission line as claimed in claim 1, wherein the medium and dispersion control elements are arranged such that the dispersion relationship of the medium diverges from the intrinsic dispersion relationship at the first and second frequencies, such that there are stopbands at the first and second frequencies.

3. The four-wave mixing radio frequency transmission line of claim 1, wherein the transmission line includes bonding contacts at either end, the bonding contacts arranged to enable the transmission line to be coupled to a wider system, wherein the bonding contacts are arranged to impedance match the transmission line to the wider system, wherein the bonding contacts include:
   a first region having a width wider than the transmission radio frequency line, the first region for coupling the transmission line to be coupled to the wider system; and
   an impedance matching region gradually narrowing from the width of the first region to the width of the transmission line,
      wherein the impedance matching region includes curved edges as the width gradually reduces.

4. The four-wave mixing radio frequency transmission line of claim 1, wherein the operational bandwidth of the transmission line is between a minimum operation frequency at or substantially at the first pump frequency, and a maximum operational frequency at or substantially at the second pump frequency.

5. The four wave mixing radio frequency transmission line of claim 1, wherein idler signal is provided as an output, such that the four-wave mixing line is a frequency downconverter.

6. The four-wave mixing radio frequency transmission line of claim 5, wherein the first pump frequency is selected based on the frequency of the input signal, to select an operational band of the frequency down converter.

7. The four-wave mixing radio frequency transmission line of claim 1, wherein the transmission line comprises a superconducting wire; and wherein the plurality of dispersion control elements comprises a plurality of resonators.

8. The four-wave mixing radio frequency transmission line of claim 7, wherein the transmission line comprises a plurality of Josephson junctions embedded along the transmission line.

9. The four-wave mixing radio frequency transmission line of claim 8, wherein the transmission line is formed of a periodically repeating structure having a group of Josephson junctions connected in series, each group of Josephson junctions coupled to a dispersion control element.

10. The four-wave mixing radio frequency: transmission line of claim 7, wherein each resonator comprises a planar capacitor and a planar inductor, such that the four-wave mixing transmission line is formed in a single plane.

11. The four-wave mixing radio frequency transmission line of claim 7, wherein the plurality of dispersion control elements comprises one or more sets of resonators, each set of resonators comprising a plurality of resonators having the same or substantially similar resonant frequency, wherein the resonant frequency of each set of resonators defines the first frequency and the second frequency at which the dispersion relationship of the medium to diverge from the intrinsic dispersion relationship.

12. The four-wave mixing radio frequency transmission line of claim 1, wherein the transmission line comprises a superconducting wire; and wherein the transmission line comprises a plurality of first regions where the impedance of the wire is altered, and a plurality of second regions where the impedance of the wire is altered, the first regions being of first length, and the second regions being of second length, different from the first length, the first and second regions arranged in a pattern to prevent formation of shockwaves in the transmission line, generated from third harmonics of the first and second pump signals.

13. The four-wave radio frequency mixing transmission line of claim 12, wherein the first and second regions are arranged in a repeating pattern having two first regions followed by a second region.

14. The four-wave mixing radio frequency transmission line of claim 12, wherein the spacing and pattern of the first and second regions determines the first frequency and the second frequency.

15. The four-wave mixing radio frequency transmission line of claim 1, wherein the medium comprises a superconducting structure; and wherein the transmission line comprises a superconducting wire; and wherein the plurality of dispersion control elements comprises a plurality of regions where the impedance of the wire is altered, such that the wire is loaded at the plurality of regions.

16. The four-wave mixing radio frequency transmission line of claim 15, wherein the transmission line comprises a plurality of Josephson junctions embedded along the transmission line.

17. The four-wave mixing radio frequency transmission line of claim 1, wherein the dispersion control elements are arranged to correct phase mismatch between the pump signals, the input signal and the idler signal.

18. The four-wave radio frequency mixing transmission line of claim 1, wherein the dispersion control elements are arranged periodically along the transmission line.

19. A four-wave mixing radio frequency method in a non-linear medium having an intrinsic dispersion relationship, the method including:
 providing a first pump signal having a first pump frequency in the medium;
 providing a second pump signal having a second pump frequency, different from the first pump signal in the medium;
 receiving an input signal to be amplified in the medium;
 enabling interaction between the first pump signal, the second pump signal and the input signal such that the input signal is amplified, and an idler signal is generated and amplified; and
 controlling the dispersion relationship of the medium to diverge from the intrinsic dispersion relationship at a first frequency. and at a second frequency, wherein the first pump frequency is near the first frequency and the second pump frequency is near the second frequency. such that the total phase difference between the input signal, the first pump signal, the second pump signal and the idler signal is kept at zero or substantially zero as the first pump signal, the second pump signal, the input signal, and the idler signal propagate line along the non-linear medium.

* * * * *

UNITED STATES PATENT AND TRADEMARK OFFICE
CERTIFICATE OF CORRECTION

PATENT NO. : 10,873,302 B2
APPLICATION NO. : 16/080972
DATED : December 22, 2020
INVENTOR(S) : Boon Kok Tan It is certified that error appears in the above-identified patent and that said Letters Patent is hereby corrected as shown below:

In the Specification

In Column 2, Line 59, delete "frequencies" and insert --frequencies.--.

In Column 4, Line 56-57, delete "frequency." and insert --frequency;--.

In Column 24, Line 24, delete "αs" and insert --αi--.

In Column 24, Line 25, delete "++αp1" and insert --+αp1--.

In the Claims

In Column 28, Line 8 (approx.), Claim 5, after "wherein" insert --the--.

In Column 28, Line 29, Claim 10, delete "frequency:" and insert --frequency--.

In Column 28, Line 53, Claim 13, delete "radio frequency mixing" and insert --mixing radio frequency--.

In Column 29, Line 9 (approx.), Claim 18, delete "radio frequency mixing" and insert --mixing radio frequency--.

In Column 30, Line 9, Claim 19, delete "frequency." and insert --frequency,--.

In Column 30, Line 11, Claim 19, delete "frequency." and insert --frequency,--.

In Column 30, Line 16, Claim 19, after "propagate" delete "line".

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*